(12) United States Patent
Tomita

(10) Patent No.: US 7,539,042 B2
(45) Date of Patent: May 26, 2009

(54) SEMICONDUCTOR DEVICE AND FABRICATION METHOD THEREOF

(75) Inventor: Hiroyoshi Tomita, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 85 days.

(21) Appl. No.: 11/783,318

(22) Filed: Apr. 9, 2007

(65) Prior Publication Data

US 2008/0056044 A1     Mar. 6, 2008

(30) Foreign Application Priority Data

Aug. 31, 2006    (JP)    ............................. 2006-237058

(51) Int. Cl.
G11C 11/24    (2006.01)
G11C 7/00    (2006.01)
G11C 8/00    (2006.01)

(52) U.S. Cl. .................. 365/149; 365/189.09; 365/226

(58) Field of Classification Search ................. 365/222, 365/200, 201, 225.7, 189.09, 189.11, 226, 365/149
See application file for complete search history.

(56) References Cited

U.S. PATENT DOCUMENTS

| | | | |
|---|---|---|---|
| 5,774,405 A * | 6/1998 | Tomishima ................. | 365/226 |
| 5,805,508 A | 9/1998 | Tobita | |
| 5,956,281 A | 9/1999 | Nakai | |
| 5,999,475 A * | 12/1999 | Futatsuya et al. ........... | 365/226 |
| 6,002,162 A | 12/1999 | Takahashi | |
| 6,377,508 B1 * | 4/2002 | Tomishima et al. .... | 365/189.11 |
| 6,449,204 B1 * | 9/2002 | Arimoto et al. ............. | 365/222 |
| 7,139,208 B2 * | 11/2006 | Arimoto et al. ............. | 365/222 |
| 7,272,065 B2 * | 9/2007 | Lovett ......................... | 365/222 |
| 7,307,907 B2 * | 12/2007 | Houston ...................... | 365/222 |
| 2002/0024873 A1 | 2/2002 | Tomishima | |

FOREIGN PATENT DOCUMENTS

JP          09223802        8/1997
WO     WO 02/23548        3/2002

OTHER PUBLICATIONS

"Symposium on VLSI Technology/Circuits"; Leading Trends; Nikkei Electronics; Jul. 17, 2006; pp. 55-56 with English Translation.
European Search Report dated Oct. 15, 2008, 9 pages.

* cited by examiner

Primary Examiner—Trong Phan
(74) Attorney, Agent, or Firm—Arent Fox LLP.

(57) ABSTRACT

The present invention suppresses the refresh failure of a DRAM due to the dispersion of a threshold of a MOSFET. The DRAM has a first unit for recording a set value of a back bias potential to be applied to a back gate of a cell transistor and a second unit for generating a back bias potential based on the set value of the back bias potential recorded in the first unit and supplying the generated back bias potential to the back gate, wherein when a threshold of a MOSFET which has a structure identical to the cell transistor and which has been fabricated in the same process as the cell transistor is greater than a target value which the cell transistor should have, a value shallower than the back bias potential for the target value is recorded in the second unit.

19 Claims, 27 Drawing Sheets

Prior Art

Prior Art

110

TIME

129

110

TIME

US 7,539,042 B2

SEMICONDUCTOR DEVICE AND FABRICATION METHOD THEREOF

CROSS-REFERENCE TO RELATED APPLICATIONS

This application is based upon and claims the benefit of priority from the prior Japanese Patent Application No. 2006-237058, filed on Aug. 31, 2006, the entire contents of which are incorporated herein by reference.

BACKGROUND OF THE INVENTION

1. Field of the Invention

The present invention relates to a semiconductor device having an MOS transistor (Metal-Oxide-Semiconductor Field Effect Transistor: MOSFET), and more particularly to a dynamic random access memory (DRAM) having memory cells comprising MOSFET and a capacitor.

2. Description of the Related Art

MOSFET is widely used as a basic element constituting a semiconductor integrated circuit. Particularly in a DRAM which enables large capacity memory, MOSFET plays a very important role as a transistor for switching used for a memory cell.

The storage principle of a DRAM is storing charge in a capacitor and controlling the in and out of the charge by a MOSFET for switching. A memory cell 101 for one bit is comprised of a cell transistor 102 (transistor for switching) and a capacitor 103, as shown in FIG. 17. For interconnects, a word line 104 and a bit line 105 are placed. The word line 104 is connected to a gate of the cell transistor 102, and the bit line 105 is connected to one of source-drain regions of the cell transistor 102. The other of the source-drain regions of the cell transistor 102 is connected to the capacitor 103. Although FIG. 17 shows only one memory cell, in an actual DRAM, many such memory cells are placed in a two dimensional matrix.

As mentioned above, in the two source-drain regions of the cell transistor 102, the bit line 105 and a capacitor 103 are connected respectively. The potentials of the bit line 105 and the capacitor 103 are not fixed, and one becomes a higher or lower potential than the other frequently according to the operation state of the DRAM. In an n-channel MOSFET, for example, an n+ region at the high potential side, out of the two n+ regions formed on both sides of a gate, functions as a drain, and an n+ region at the low potential side functions as a source. However in a cell transistor, it is not fixed which n+ region becomes a higher potential (or lower potential), so both regions are called "source-drain regions". For a p-channel MOSFET as well, the two p+ regions are both called "source-drain regions".

To record one bit, voltage is applied to the word line 104 first, to turn the cell transistor 102 ON, and the charge is supplied from the bit line 105 to the capacitor 103 (or the charge stored in the capacitor 103 is discharged to the bit line 105).

When charging to (or discharging from) the capacitor 103 completes, the cell transistor 102 is turned OFF, so that the charge stored in the capacitor 103 is not discharged even if the potential of the bit line 105 drops (or the empty capacitor 103 is not charged even if the potential of the bit line 105 rises). In this way, one bit of information is stored in the memory cell 101.

However the charge stored in the capacitor 103 is gradually discharged over time, so the same storage content must be rewritten before the memory is deleted. This rewriting operation is called "refresh".

As shown in FIG. 18, the above mentioned discharge is generated by the current 106 which leaks from the source-drain region at the capacitor 103 side to the back gate 107. This leak current will be described in more detail. FIG. 19 is an example of the cross-sectional view of memory cells. FIG. 19 shows two memory cells 101. The capacitor 103 is a trench type capacitor. In the two cell transistors 102, respective source-drain regions are combined and form one region 109. The bit line 105 is connected to this region. By this structure, the area for connecting the bit line 105 and the source-drain regions of the memory cells are decreased to half, and the degree of integration of the DRAM improves.

In the example shown in FIG. 19, the cell transistor 102 is an n-channel MOSFET. Therefore the source-drain regions 108 and 109 are n+ regions. The back gate region 107 is a p type Si. On the p type semiconductor layer positioned between the source-drain regions 108 and 109, the word line 104, which functions as a gate, runs in a vertical direction with respect to the page face via a thin gate oxide film. The word line 104 functions as a gate of the cell transistor 102 which is a MOSFET. These memory cells are electrically isolated from other memory cells by an element isolation layer 130, which is thick $SiO_2$ film. The memory cells are also electrically isolated from the substrate by a pnp structure comprised of a p-type back gate region 107, n-type internal potential layer 131, and p type substrate 132 ("n+" is written as "$N^+$" in FIG. 19).

In a DRAM, 0V or less potential is applied to the back gate region 107. The potential of the source-drain regions 108 and 109 changes in the 0V or higher range. Therefore to the pn junction comprised of the source-drain regions 108 and 109 and the back gate region 107, back bias is always being applied. Because of this, very little current 106 leaks from the source-drain region 108 to the back gate region 107. However, since the capacity of the capacitor 103 is small, the capacitor 103 is gradually discharged even by this very small leak current. The current 106 which leaks into the back gate region 107 enters the back gate power supply, and eventually reaches the ground.

This discharging phenomena is called a "junction leak", and is a major cause of the capacitor 103 being discharged. In a DRAM, in order to replenish the discharged charge, charge 116 is frequently re-injected to the capacitor 103 from the bit line 105, as shown in FIG. 20. This operation is called "refresh". Refresh is repeated in a short cycle (e.g. 100 ms), as shown in FIG. 21, and is repeated before the potential of the capacitor 103 drops to the minimum potential 110, recognized as high level (Non-Patent Document "Semiconductor Engineering, Second Edition", Tokyo Denki University 2004, p. 187).

If the leak current 106 from the capacitor 103 is excessive, the capacitor 103 cannot be recharged sufficiently even if the charge is re-injected from the bit line 105. Given this situation, the memory cell 101 does not function as a storage element.

To prevent such a situation, the junction leak is suppressed by optimizing the fabrication steps in prior art, so as to maintain good memory holding characteristics.

SUMMARY OF THE INVENTION

Recently semiconductor integrated circuit processing technology is miniaturizing, with the minimum line width of an interconnect 65 nm or 45 nm. The drive voltage thereof is also decreasing to 1.0V or 0.7V. Accordingly the dispersion of threshold Vth of MOSFET is becoming a major problem (Non-patent Document "Nikkei Electronics", Nikkei BP, 2006, P. 55).

This problem is becoming conspicuous in static random access memories (SRAM). However the present inventors discovered that in DRAM as well, memory cells which are not refreshed normally increase if the threshold Vth of the cell transistor 102 disperses.

FIG. 22 shows a failure cell generation ratio with respect to the threshold Vth of the cell transistor 101. The abscissa shows the threshold Vth of the cell transistor 101, and the ordinate shows a generation ratio of chips (integrated circuits) having a failure cell (failure ratio). In the example shown in FIG. 22, the fabrication steps have been optimized so that the threshold Vth becomes 0.7V. The minimum line width of an interconnect is 130 nm, and the gate oxide film thickness is 17 nm.

The line 111 at the left in FIG. 22 shows a generation ratio of failure cells which are generated by leak current 115 from the cell transistor 102 to the bit line 105, as shown in FIG. 23 and FIG. 24. The line 112 at the right in FIG. 22 shows a generation ratio of failure cells which are caused when the charge 116, which is re-injected from the bit line 105 to the capacitor 103 at refresh (see FIG. 20), is insufficient. The line 113 at the bottom in FIG. 22 shows a range of dispersion of Vth which is generated in the optimized fabrication steps.

Now the cause of the generation of the failure cells indicated by the lines 111 and 112 will be described in detail.

The cause of the generation of these failure cells is deeply related to the refresh operation of the DRAM, so the refresh operation of the DRAM will be described first.

FIG. 25 shows an example of a basic circuit configuration of a DRAM called a "folded bit line" type. The DRAM is comprised of a memory cell array 115 where many pairs of memory cells C1 and C2 are placed in a two dimensional matrix, word lines W1 and W2, row decoder 116 for driving the word lines W1 and W2, bit lines D and D', a column select switch 120 to which the bit lines D and D' are connected, a column decoder 118 to which the column select switch 120 is connected, a sense amplifier 119, bit line precharge power supply 121, precharge switches 122 and 123, an input/output buffer 117 and so on. The bit lines D and D' form a pair, and the same number of memory cells C1 and C2 are connected respectively. The memory cells C1 and C2 are normally comprised of a cell transistor 102, which is an n-channel MOSFET, and a capacitor 103. A DRAM comprised of a memory cell array, where many memory cells are placed in a two-dimensional matrix, is called an "open bit" type DRAM.

The refresh operation starts with opening the precharge switches 122 and 123, and connecting the bit lines D and D' to the bit line precharge power supply 121. By this, the potentials of the bit lines D and D' become the potential Vii/2 (Vii is an internal potential) of the bit line precharge power supply 121. The internal potential Vii is potential to be a reference of storage operation of the memory cell. In the memory cell 101, the potential of the capacitor 103 is Vii (>0) in the case of high level, and the potential of the capacitor 103 is the ground potential Vss (=0) in the case of low level. Since the bit line D has a parasitic capacitance 124, the potential of the bit line D is maintained at Vii/2, even if the precharge switch 122 is closed. This operation is called a "precharge". During refresh operation, the column select switch 120 is in OFF state.

When precharge completes, the precharge switches 122 and 123 connected to the bit line D are closed. Then the word line W1 is set to high level, and the cell transistor 102 of the memory cell C1 is turned ON. At this time, the capacitor 103 of the memory cell C1 and the floating capacitor 124 are connected in parallel, so the potential of the bit line changes from Vii/2 (e.g. 1.5V). In other words, if the capacitor 103 is at high level, the potential of the bit line becomes Vii/2+ΔV, and becomes Vii/2−ΔV if the capacitor 3 is at low level (ΔV>0). The floating capacitor 124 has larger capacitance than the capacitor 103, so the change of the potential of the bit line, that is ΔV, is small, several hundred mV. Therefore, as described later, this small change is amplified by the sense amplifier 119, and Vii or Vss (=0V) is output to the bit lines D and D'.

In the bit line D', no memory cell connected to the word line W1 exists. So even if the word line W1 is set to high level, the potential of the bit line D' is maintained at Vii/2 (word line W1 remains at low level). After the word line W1 becomes high level and a predetermined time elapses, the sense amplifier 119 is activated. The sense amplifier 119, which is activated detects the potential difference between the bit lines D and D'. If the result is a positive value ((Vii/2+ΔV)−Vii/2=ΔV), the sense amplifier 119 outputs a high level voltage (Vii) to the bit line D, and outputs a low level voltage (Vss (=0V)) to the bit line D'. If the potential difference is a negative value ((Vii/2−ΔV)−Vii/2=−ΔV), the sense amplifier 119 outputs a low level voltage (Vss (=0V)) to the bit line D, and outputs a high level voltage (Vii) to the bit line D'.

Since the cell transistor 102 of the memory cell C1 remains ON, the capacitor 103 of the memory cell C1 becomes a high level (or low level), and memory of the memory cell c1 can be rewritten. Then the cell transistor 102 of the memory cell C1 is turned OFF, and one refresh operation ends.

During this time, the word line W2 is in the OFF state, so the stored content of the memory cell C2 is maintained.

To refresh the memory cell C2, the voltage levels to be applied to the word lines W1 and W2 are reversed.

When the potentials of the bit lines D and D' change, noise is generated in the word lines W1 and W2. However in the case of the folded bit line type DRAM, if one of the potentials of the bit lines D and D' is at high level, the other is always at low level. Therefore the noises induced to the word lines W1 and W2 cancel each other. In other words, an advantage of the folded bit line type DRAM is that the noises induced to the word lines by the change of potentials of the bit lines are very small.

Now generation of a failure cell due to the insufficiency of charge 116 re-injected from the bit line D to the capacitor 103 during refresh (see FIG. 20) will be described. The insufficiency of the re-injected charge causes the generation of the line 112 at the right in FIG. 22.

FIG. 26 shows a time-based change of potential of each element constituting the memory cell C1 in a refresh operation. The ordinate indicates potential, and the abscissa indicates elapsed time from the start of the refresh operation. In FIG. 26, the potential 125 of the word line W1, the potential 126 of the bit line D, and the potential 127 of the capacitor 103 are shown. FIG. 26 shows an example when the capacitor 103 in a high level state is refreshed.

The ordinate shows the word line non-selecting potential VNN, the word line setting potential Vpp, the precharge potential Vii/2, and the potential Vii when the memory cell is in a high level state. Typical values of VNN, Vpp and Vii are −0.3V, 2.6V and 1.5V respectively. The periods 0 to t1 shown in the abscissa are periods for precharge. When precharge is over, the word line W1 is turned ON, and the cell transistor 102 becomes ON state. Then the bit line D and the capacitor 103 are conducted, and current flows from the capacitor 103 in the high level state to the bit line D. Because of this, the potential 126 of the bit line D rises. At time t2, when the potential 126 of the bit line D stabilizes, the sense amplifier 119 is activated. By the activated sense amplifier 119, the capacitor 103 is recharged. At time t3, when the capacitor is sufficiently charged and the potential 127 thereof stabilizes, the cell transistor 102 is turned OFF, and the capacitor 103 is disconnected from the bit line D. By this, refresh of the memory cell C1 completes.

The word line setting potential Vpp is set to a value higher than the high level potential Vii of the bit line D by Vth (threshold of the cell transistor C1) or more (Vpp>Vii+Vth). This is because the cell transistor 102 is not turned ON unless the word line setting potential Vpp is higher than the potential of the source-drain region at the capacitor side (of the cell transistor C1) by Vth or more. In other words, if the word line setting potential Vpp is smaller than Vii+Vth, the recharging voltage (Vpp−Vth) of the capacitor 103 does not reach Vii (Vpp−Vth<Vii).

The word line setting potential Vpp is normally set to a value higher than Vii+Vth by 0.3 to 0.4V in order to increase the charging speed to the capacitor 103.

A DRAM is designed so that when the threshold Vth is near the target value (center of the line 113 in FIG. 22), the potential 127 of the capacitor 103 rises to a normal value Vii. However if the threshold Vth becomes a large value Vth' exceeding a tolerance, the cell transistor 102 turns OFF before the potential of the capacitor 103 reaches Vii, as shown by the curve 128 in FIG. 26, and the rise of the potential of the capacitor 103 stops. As a result, the charge to be re-injected to the capacitor 103 becomes insufficient. Then sufficient refresh is not performed, and the memory cell Cl causes an operation failure. This operation failure will be called a "restore failure" herein below. The above is a cause of the generation of a failure cell shown by the line 112 in FIG. 22. FIG. 27 shows the refresh operation of a DRAM in which the restore failure occurred. The ordinate indicates inter-terminal voltage of capacitor, and the abscissa indicates time. The solid curve line indicates the refresh operation of the DRAM in restore failure state. The broken curve line indicates a normal refresh operation. In FIG. 27, the minimum potential 110 (e.g. 0.85V) recognized as high level is also shown.

Finally, the generation of failure cells caused by leak current 115 from the cell transistor 102 to the bit line 105 will be described. The leak current 115 to the bit line 105 is the cause of generating the line 111 at the left in FIG. 22.

This leak current is generated after the cell transistor 102 is turned OFF at time t3. During this period, the potential of the bit line 105 changes among Vss, Vii/2 and Vii, depending on the operation state of the DRAM. In other words, each time another cell connected to the same bit line 105 (or a bit line forming a pair) is accessed or refreshed, the bit line potential changes between Vss and Vii. When no cell is accessed or refreshed, the bit line potential is maintained at Vii/2.

During this period, the capacitor 103 is maintained at a high potential. The potential of the bit line 105, on the other hand, is maintained at a low potential for a long time, depending on the operation state of the DRAM.

Even in such a case, leak current is small enough and does not cause a problem if the threshold Vth of the cell transistor 102 is near the target value.

In MOSFET, even in a region where the voltage Vgs between the gate and the source is less than the threshold Vth (that is, MOSFET is in an OFF state), current (drain current) slightly flows between the source and drain regions. In this region, the drain current ID radically changes when the difference between the voltage Vgs, which is voltage between the gate and source, and the threshold Vth (Vgs−Vth) changes. Specifically, if the difference of the voltage Vgs between the gate and source and the threshold Vth (Vgs−Vth) increases 0.1V, the drain current increases about 10 times.

Therefore if the threshold Vth of the cell transistor 102 becomes lower than the tolerance, the difference of the voltage Vgs between the gate and source and the threshold Vth (Vgs−Vth) increases, and the leak current between the source and drain regions radically increases. As a result, the leak current between the source and drain regions becomes about the same or more than the junction leak. In such a case, the potential 129 of the capacitor 103 becomes lower than the minimum potential 110 recognized as high level before the capacitor 103 is recharged by refresh, as shown in FIG. 28. The ordinate indicates inter-terminal voltage of capacitor, and the abscissa indicates time. As a result, the memory cell Cl causes an operation failure. The broken curve line in FIG. 28 indicates a normal refresh operation. This operation failure is called an "off leak current failure" herein below.

As described above, a semiconductor integrated circuit having a MOSFET of which size is small and drive voltage is low, particularly a DRAM having memory cells comprised of MOSFET and capacitors, has a problem in that an operation failure tends to occur by a restore failure or off leak current failure.

With the foregoing in view, it is an object of the present invention to provide a semiconductor integrated circuit (particularly a DRAM) which can suppress a restore failure and off leak current failure, and a fabrication method thereof.

[Means of Solving the Problems]

To achieve the above object, the present invention is structured as follows, and has the following functions and effects.

(First Invention)

The first invention is a semiconductor device comprising a memory cell which comprises a switch which is an MOS transistor and a capacitor, and in which a first source-drain region of the MOS transistor is connected to one electrode of the capacitor; a control circuit for recording one bit of memory data by storing charge in the capacitor or discharging stored charge, and reading one bit of memory data by reading a potential of the capacitor; and a refresh circuit for rewriting the memory data recorded in the memory cell to the memory cell periodically or based on a received command, the semiconductor device further comprising: a storage circuit 5 for recording back bias potential which records a set value of a back bias potential to be applied to a back gate of the MOS transistor; and a back gate potential generation power supply 8 9 which generates a back bias potential based on the set value of the back bias potential recorded in the storage circuit for recording back bias potential, and supplies the generated back bias potential to the back gate, wherein when a threshold of the MOS transistor is greater than a target value which is set as a threshold which the MOS transistor should have, a value of the back bias potential which is shallower than the set value of the back bias potential for the target value is recorded as the set value of the back bias potential.

According to the first invention, the generation of a restore failure can be suppressed even if the threshold of the MOS transistor (cell transistor) exceeds the target value.

"Exceeds" and "shallow" indicate a size relationship of absolute values of two quantities compared.

(Second Invention)

The second invention is a semiconductor device comprising: a memory cell which comprises a switch which is an MOS transistor and a capacitor, and in which a first source-drain region of the MOS transistor is connected to one electrode of the capacitor; a control circuit for recording one bit of memory data by storing charge in the capacitor or discharging stored charge, and reading one bit of memory data by reading a potential of the capacitor; and a refresh circuit for rewriting the memory data recorded in the memory cell to the memory cell periodically or based on a received command, the semiconductor device further comprising: a storage circuit 5 for recording back bias potential which records a set value of a back bias potential to be applied to a back gate of the MOS transistor; and a back gate potential generation power supply 8 9 which generates a back bias potential based on the set value of the back bias potential recorded in the storage circuit for recording back bias potential, and supplies the generated back bias potential to the back gate, wherein when a threshold of an MOS transistor for monitoring which has a structure identical to and was fabricated in the same process as the MOS transistor is greater than a target value which is set as a threshold which the MOS transistor should have, a value of the back bias potential which is shallower than the set value of the back bias potential for the target value is recorded in the storage circuit for recording the back bias potential, as the set value of the back bias potential.

According to the second invention, the threshold of the MOS transistor can be easily known.

(Third Invention)

The third invention is a semiconductor device comprising: a memory cell which comprises a switch which is an MOS transistor and a capacitor, and in which a first source-drain region of the MOS transistor is connected to one electrode of the capacitor; a control circuit for recording one bit of memory data by storing charge in the capacitor or discharging stored charge, and reading one bit of memory data by reading a potential of the capacitor; and a refresh circuit for rewriting the memory data recorded in the memory cell to the memory cell periodically or based on a received command, the semiconductor device further comprising: a storage circuit 5 for word line non-selecting potential which records a set value of a word line non-selecting potential to be applied to a gate of the MOS transistor for closing the switch; and a word line non-selecting potential generation circuit 6 7 which generates a word line non-selecting potential based on the set value of the word line non-selecting potential recorded in the storage circuit for word line non-selecting potential, and supplies the generated word line non-selecting potential to the gate, wherein when a threshold of the MOS transistor is smaller than a target value which is set as a threshold which the MOS transistor should have, a value of word line non-selecting potential which is deeper than the set value of the word line non-selecting potential for the target value is recorded as the set value of the word line non-selecting potential.

According to the third invention, the generation of an off leak current failure can be suppressed even if the threshold of the MOS transistor (cell transistor) does not reach the target value.

(Fourth Invention)

The fourth invention is a semiconductor device comprising: a memory cell which comprises a switch which is an MOS transistor and a capacitor, and in which a first source-drain region of the MOS transistor is connected to one electrode of the capacitor; a control circuit for recording one bit of memory data by storing charge in the capacitor or discharging stored charge, and reading one bit of memory data by reading a potential of the capacitor; and a refresh circuit for rewriting the memory data recorded in the memory cell to the memory cell periodically or based on a received command, the semiconductor device further comprising: a storage circuit 5 for word line non-selecting potential which records a set value of a word line non-selecting potential to be applied to a gate of the MOS transistor for closing the switch; and a word line non-selecting potential generation circuit 6 7 which generates a word line non-selecting potential based on the set value of the word line non-selecting potential recorded in the storage circuit for word line non-selecting potential, and supplying the generated word line non-selecting potential to the gate, wherein when a threshold of an MOS transistor for monitoring which has a structure identical to and was fabricated in the same process as the MOS transistor is smaller than a target value in fabrication which is set as a threshold which the MOS transistor should have, a value of the word line non-selecting potential which is deeper than the set value of the word line non-selecting potential for the target value is recorded in the storage circuit for word line non-selecting potential as the set value of the word line non-selecting potential.

According to the fifth invention, the threshold of the MOS transistor can be easily known.

(Fifth Invention)

The fifth invention is a semiconductor device according to claim 1, further comprising: a storage circuit 5 for word line non-selecting potential which records a set value of a word line non-selecting potential to be applied to a gate of the MOS transistor for closing the switch; and a word line non-selecting potential generation circuit 6 7 which generates a word line non-selecting potential based on the set value of the word line non-selecting potential recorded in the storage circuit for word line non-selecting potential, and supplies the generated word line non-selecting potential to the gate, wherein when a threshold of the MOS transistor is smaller than a target value which is set as a threshold which the MOS transistor should have, a value of word line non-selecting potential which is deeper than the set value of the word line non-selecting potential for the target value is recorded as the set value of the word line non-selecting potential.

According to the fifth invention, the generation of a restore failure can be suppressed even if the threshold of the MOS transistor (cell transistor) exceeds the target value, and the generation of off leak current failure can be suppressed even if the threshold of the MOS transistor (call transistor) does not reach the target value.

(Sixth Invention)

The sixth invention is a semiconductor device according to claim 2, further comprising: a storage circuit 5 for word line non-selecting potential which records a set value of a word line non-selecting potential to be applied to a gate of the MOS transistor for closing the switch; and a word line non-selecting potential generation circuit 6 7 which generates a word line non-selecting potential based on the set value of the word line non-selecting potential recorded in the storage circuit for word line non-selecting potential, and supplies the generated word line non-selecting potential to the gate, wherein when a threshold of an MOS transistor for monitoring which has a structure identical to and was fabricated in the same process as the MOS transistor is smaller than a target value in fabrication which is set as a threshold which the MOS transistor should have, a value of the word line non-selecting potential which is deeper than the set value of the word line non-selecting potential for the target value is recorded in the storage circuit for word line non-selecting potential as the set value of the word line non-selecting potential.

(Seventh Invention)

The seventh invention is a semiconductor device according to claim 5, wherein the set value of the back bias potential recorded in the storage circuit for recording back bias potential and the set value of the word line non-selecting potential recorded in the storage circuit for word line non-selecting potential are the same.

According to the seventh invention, operation efficiency improves since data to be written in the storage circuits are the same. Also one storage circuit can be shared as the storage circuit for recording back bias potential and the storage circuit for word line non-selecting potential.

(Eighth Invention)

The eighth invention is a semiconductor device according to claim 6, wherein the set value of the back bias potential recorded in the storage circuit for recording back bias potential and the set value of the word line non-selecting potential recorded in the storage circuit for word line non-selecting potential are the same.

According to the eighth invention, operation efficiency improves since data to be written in the storage circuits are the same. Also one storage circuit can be shared as the storage circuit for recording back bias potential and the storage circuit for word line non-selecting potential.

(Ninth Invention)

The ninth invention is a semiconductor device according to claim 2, wherein the memory cell and one or a plurality of the MOS transistors for monitoring are formed on the same chip.

According to the ninth invention, the threshold of the MOS transistor (cell transistor) can be accurately estimated.

(Tenth Invention)

The tenth invention is a semiconductor device according to claim 4, wherein the memory cell and one or a plurality of the MOS transistors for monitoring are formed on the same chip.

According to the tenth invention, the threshold of the MOS transistor (call transistor) can be accurately estimated.

(Eleventh Invention)

The eleventh invention is a semiconductor device according to claim 9, wherein there are a plurality of the MOS transistors for monitoring, and sources, drains and gates of the MOS transistors for monitoring are connected in parallel respectively.

(Twelfth Invention)

The twelfth invention is a semiconductor device according to claim 10, wherein there are a plurality of the MOS transistors for monitoring, and sources, drains and gates of the MOS transistors for monitoring are connected in parallel respectively.

(Thirteenth Invention)

The thirteenth invention is a fabrication method for the semiconductor device according to claim 2 comprising: a first step of connecting a source of the MOS transistor for monitoring to a ground potential, applying a first predetermined potential to a gate of the MOS transistor for monitoring, applying a second predetermined potential to a drain of the MOS transistor for monitoring, and measuring a current value which flows into the drain; a second step in which when the current value is smaller than a predetermined current value, a step of increasing a potential to be applied to the gate by a predetermined value and remeasuring a value of current which flows into the drain is repeated until a value of current which flows into the drain exceeds the predetermined current value, and a potential being applied to the gate when the value of current which flows into the drain exceeded the predetermined current value is set as a threshold of the MOS transistor for monitoring; a third step in which when the current value exceeds the predetermined current value, a step of decreasing a potential to be applied to the gate by a predetermined value and remeasuring a value of current which flows into the drain is repeated until a value of current which flows into the drain becomes smaller than the predetermined current value, and a potential being applied to the gate when a value of current which flows into the drain becomes smaller than the predetermined current value is set as a threshold of the MOS transistor for monitoring; and a step of recording one or both of a set value of the back bias potential and a set value of the word line non-selecting potential determined based on the threshold of the MOS transistor for monitoring, acquired in the second or third step, into one or both of the storage circuit for recording back bias potential and the storage circuit for word line non-selecting potential.

According to the thirteenth invention, the semiconductor device can be fabricated based on an accurate estimated threshold value of the MOS transistor (cell transistor).

(Fourteenth Invention)

The Fourteenth is a fabrication method for the semiconductor device according to claim 2 comprising: a first step of connecting a source of the MOS transistor for monitoring to a ground potential, applying a predetermined potential to a gate of the MOS transistor for monitoring, supplying a predetermined current to a drain of the MOS transistor for monitoring and measuring a potential value of the drain; a second step in which when the potential value exceeds a predetermined potential value, a step of increasing a potential to be applied to the gate by a predetermined value and remeasuring a value of potential of the drain is repeated until a value of the potential of the drain becomes smaller than the predetermined potential value, and a potential being applied to the gate when a value of potential of the drain becomes smaller than the predetermined potential value is set as a threshold of the MOS transistor for monitoring; a third step in which when the potential value is smaller than the predetermined potential value, a step of decreasing a potential to be applied to the gate by a predetermined value and remeasuring a value of potential of the drain is repeated until a value of potential of the drain exceeds the predetermined potential value, and potential being applied to the gate when a value of potential of the drain exceeds the predetermined potential value is set as a threshold of the MOS transistor for monitoring; and a step of recording one or both of a set value of the back bias potential and a set value of the word line non-selecting potential determined based on the threshold of the MOS transistor for monitoring, acquired in the second or third step, into one or both of the storage circuit for recording back bias potential and the storage circuit for word line non-selecting potential.

According to the Fourteenth invention, the semiconductor device can be fabricated based on the accurate estimated threshold value of the MOS transistor (cell transistor).

(Fifteenth Invention)

The fifteenth invention is a fabrication method for the semiconductor device according to claim 2 comprising: a confirmation step of confirming whether a gate of the MOS transistor for monitoring and one or both of source and drain thereof are shorted; a threshold estimation step of executing all the steps according to claim 13 when the gate and one or both of the source and the drain are not shorted; a pseudo-threshold setting step of setting a predetermined threshold as a threshold of the MOS transistor for monitoring when the gate and one or both of the source and the drain are shorted; and a step of recording one or both of a set value of the back bias potential and a set value of the word line non-selecting potential determined based on the threshold of the MOS transistor for monitoring, acquired in the threshold estimation step or the pseudo-threshold setting step, into one or both of the storage circuit for recording back bias potential and the storage circuit for word line non-selecting potential.

According to the fifteenth invention, the unnecessary measurement of a threshold can be excluded when the estimation of the threshold of the MOS transistor (cell transistor) is difficult.

(Sixteenth Invention)

The sixteenth invention a fabrication method for the semiconductor device according to claim 2 comprising: a confirmation step of confirming whether a gate of the MOS transistor for monitoring and one or both of source and drain thereof are shorted; a threshold estimation step of executing all the steps according to claim 14 when the gate and one or both of the source and the drain are not shorted; a pseudo-threshold setting step of setting a predetermined threshold as a threshold of the MOS transistor for monitoring when the gate and one or both of the source and the drain are shorted; and a step of recording one or both of a set value of the back bias potential and a set value of the word line non-selecting potential determined based on the threshold of the MOS transistor for monitoring, acquired in the threshold estimation step or the pseudo-threshold setting step, into one or both of the storage circuit for recording back bias potential and the storage circuit for word line non-selecting potential.

According to the sixteenth invention, the unnecessary measurement of a threshold can be excluded when the estimation of the threshold of the MOS transistor (cell transistor) is difficult.

(Seventeenth Invention)

The seventeenth invention is a fabrication method for the semiconductor device according to claim 15, wherein the predetermined threshold is a target value being set as a threshold which the MOS transistor of the semiconductor device should have.

According to the seventeenth invention, a value which appears most frequently as a threshold can be recorded in the semiconductor device even if the estimation of a threshold of the MOS transistor (cell transistor) is difficult.

(Eighteenth Invention)

The eighteen is a fabrication method for the semiconductor device according to claim 16, wherein the predetermined threshold is a target value being set as a threshold which the MOS transistor of the semiconductor device should have.

According to the eighteenth invention, a value which appears most frequently as a threshold can be recorded in the semiconductor device even if the estimation of a threshold of the MOS transistor (cell transistor) is difficult.

(Nineteenth Invention)

The nineteenth invention is a semiconductor device according to claim 1, wherein the thickness of gate oxide film of the MOS transistor is 0.5 nm to 10 nm.

[Effect of the Invention]

According to the present invention, in a semiconductor integrated circuit having a MOSFET, particularly in a DRAM having cells comprised of MOSFET and a capacitor, the generation of a restore failure and off leak current failure can be suppressed even if the threshold of a MOSFET disperses as the miniaturization of element structure and the decrease of drive voltage advance.

INDUSTRIAL APPLICABILITY

The present invention can be used in a manufacturing industry of semiconductor devices, particularly DRAMs, and in a manufacturing industry of electronic equipment using semiconductor devices as composing elements.

DESCRIPTION OF THE PREFERRED EMBODIMENTS

Embodiments of the present invention will now be described with reference to the drawings. The technical scope of the present invention, however, is not limited to these embodiments, but shall include matters stated in the Claims and equivalent thereof.

(1) Device Structure

Figure 1:
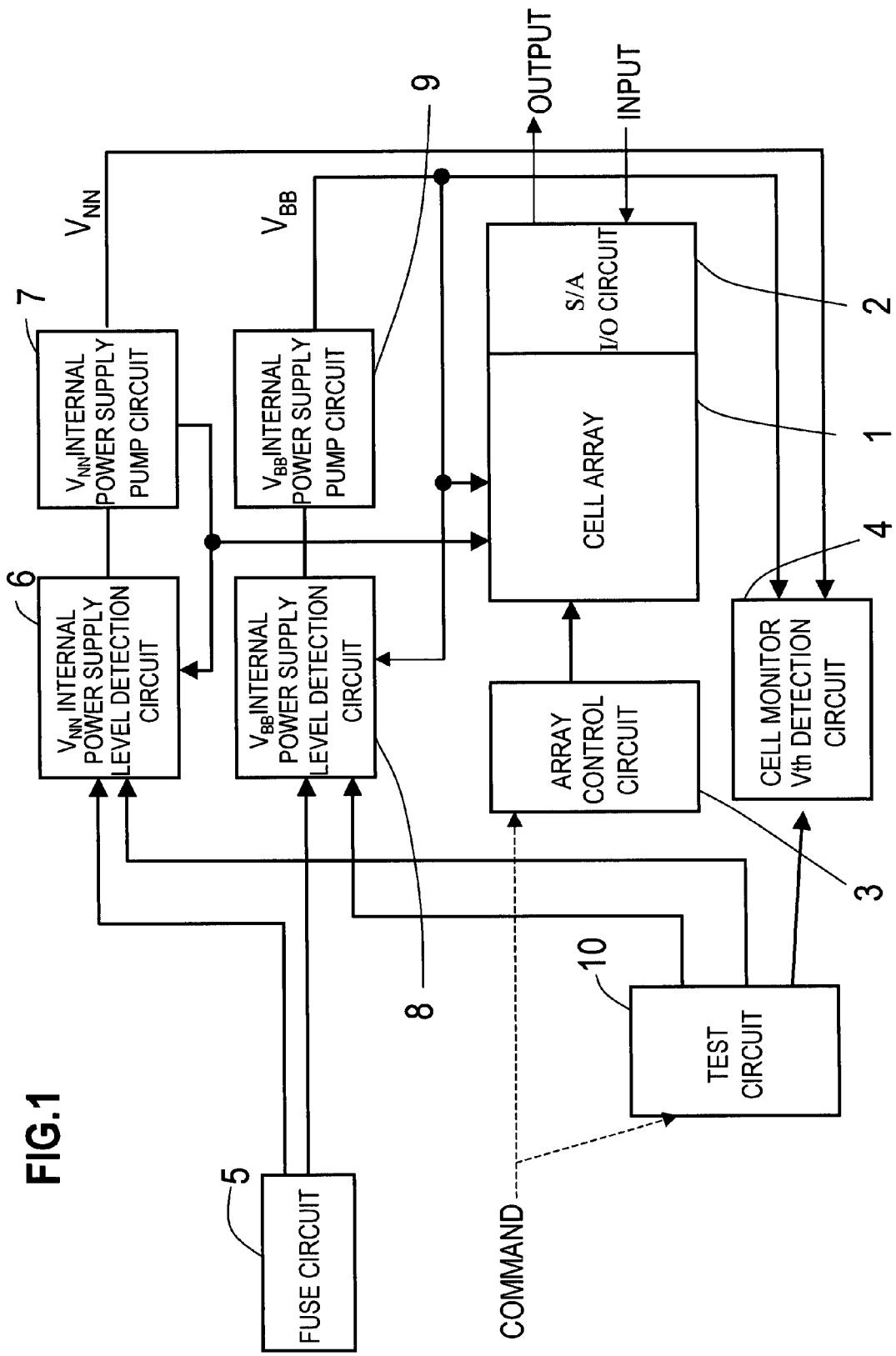
FIG. 1 is a circuit diagram of a DRAM according to the present invention.

FIG. 1 is a circuit diagram depicting a major section of a DRAM circuit according to the present invention. Just like ordinary DRAMs, the DRAM in FIG. 1 is comprised of a cell array 1, which has an n-channel MOSFET and a capacitor, a sense amplifier, an input/output circuit 2, and an array control circuit 3.

The DRAM in FIG. 1 has a cell monitor Vth detection circuit 4, which is comprised of MOSFET, which has a structure identical to and is fabricated in the same fabrication process as a cell transistor of the cell array 1. The cell monitor Vth detection circuit 4 is a circuit for estimating a threshold of a cell transistor constituting the cell array 1. A test circuit 10 controls the cell monitor Vth detection circuit 4 and the array control circuit 3 based on a command which is input from the outside. As a result, a threshold of a MOSFET formed in the cell monitor Vth detection circuit 4 can be measured from the outside.

The DRAM in FIG. 1 also has a fuse circuit 5. This fuse circuit 5 is a fuse disconnection type P-ROM (Programmable Read Only Memory). In the fuse circuit 5, a word line non-selecting potential VNN and a back gate potential VBB defined for each DRAM chip are recorded. These potentials are determined so as to suppress a restore failure and off leak current failure. Another non-volatile memory may be used instead of the fuse circuit 5.

These potentials are determined based on an estimated value of a threshold Vth for each DRAM chip, which is acquired based on a threshold of the MOSFET in the cell monitor Vth detection circuit 4. Specifically, if it is estimated that the threshold Vth of the cell transistor is higher than a target volume, the back gate potential of the cell transistor is set shallow. If it is estimated that the threshold of the cell transistor is lower than the target value, the word line non-selecting potential VNN is set deep. Setting the word line non-selecting potential VNN deep means changing the word line non-selecting potential VNN in the direction of negative potential. Setting it shallow means the opposite thereof.

If the threshold of the cell transistor can be measured, the word line non-selecting potential VNN and back gate potential VBB may be directly determined based on the threshold of the cell transistor. In order to measure the threshold of the cell transistor, a lead line for measuring the threshold is formed in a part of the cell transistors. In other words, a source-drain region of the cell transistor is connected to one end of the lead line, and an electrode pad to which the probe of an LSI tester can contact is connected to the other end. Two of these lead lines are connected to a part of the cell transistors respectively, so that two source-drain regions can be electrically connected with an external measurement system by the lead lines.

The DRAM in FIG. 1 has a VNN internal power supply level detection circuit 6, VNN internal power supply pump circuit 7, VBB internal power supply level detection circuit 8 and VBB internal power supply pump circuit 9. The VNN internal power supply level detection circuit 6 and VBB internal power supply pump circuit 7 generates a word line non-selecting potential VNN based on data recorded in the fuse circuit 5, and supplies it to the cell array 1. The VBB internal power supply level detection circuit 8 and VBB internal power supply pump circuit 9 generate a back gate potential VBB based on data recorded in the fuse circuit 5, and supplies it to the cell array 1.

Figure 2:
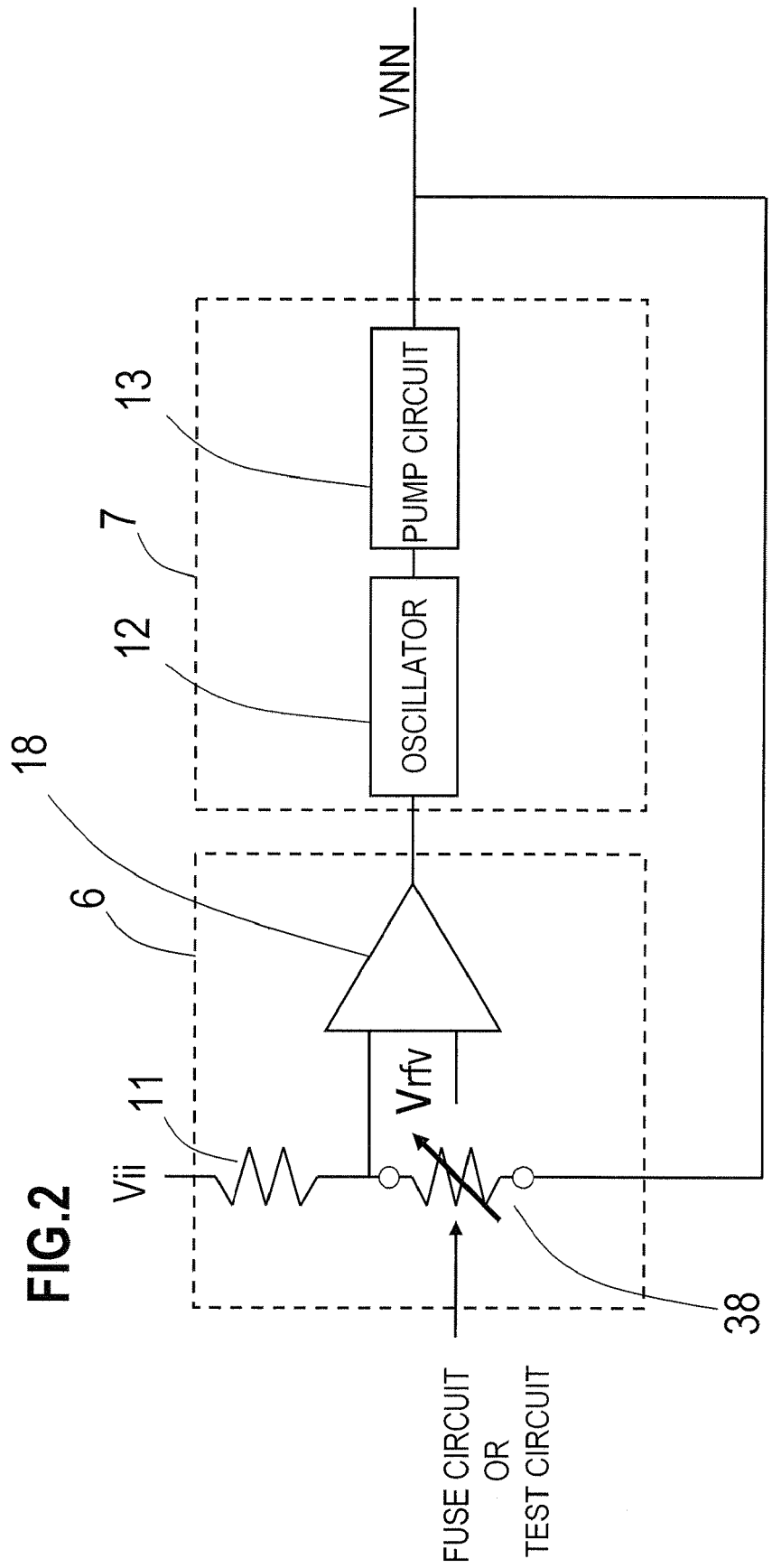
FIG. 2 is a diagram depicting a VNN internal power supply level detection circuit and VNN internal power supply pump circuit.

As FIG. 2 shows, the VNN internal power supply level detection circuit 6 is comprised of a variable resistor 38, resistor 11 and comparator 18. A resistance value of the variable resistor 38 changes based on the data recorded in the fuse circuit 5. The output of the VNN internal power supply pump circuit 7 is fed back by the variable resistor 38 and the resistor 11, and is compared with a reference voltage Vrfv by the comparator 18. If the feedback value is higher than the reference voltage Vrfv ($<0$) as a result of comparison, the VNN internal power supply pump circuit 7 is operated, and if the feedback value is lower than the reference voltage Vrfv, the operation of the VNN internal power supply pump circuit 7 is stopped. The VNN internal power supply pump circuit 7 is comprised of a oscillator 12 and a pump circuit 13.

Figure 3:
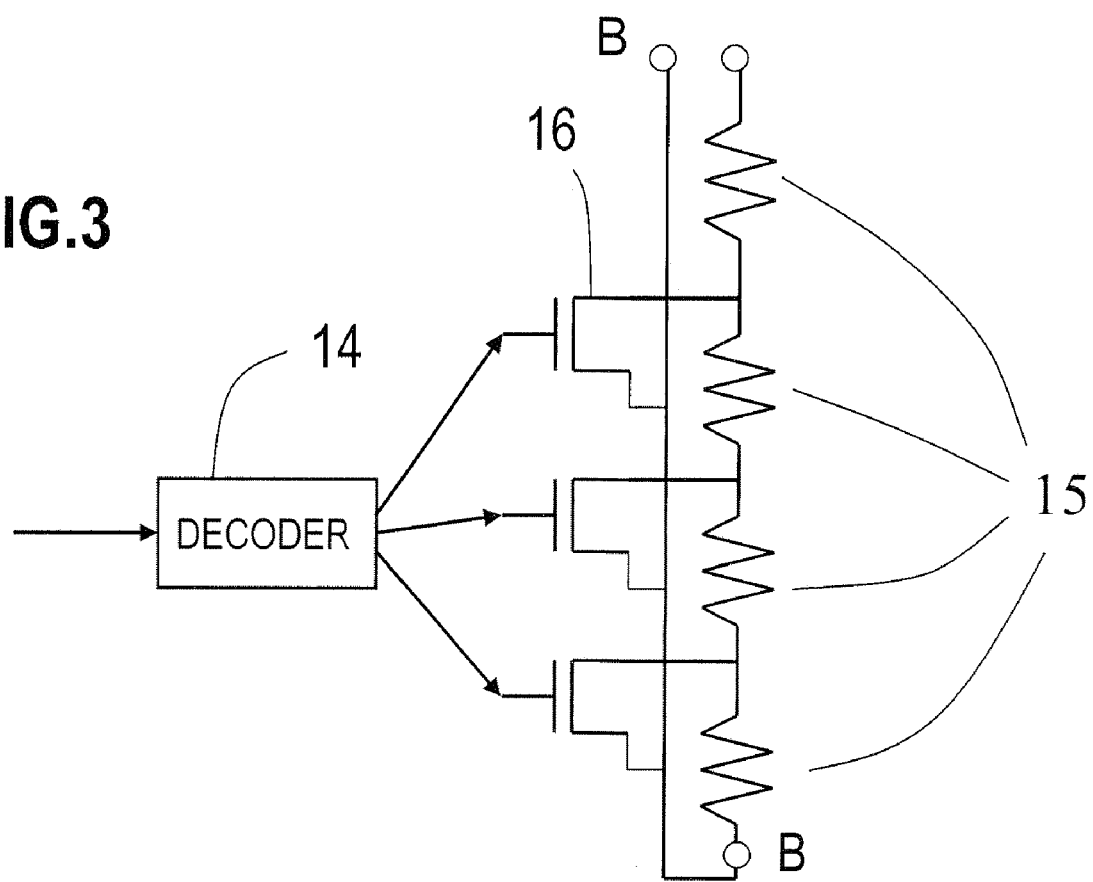
FIG. 3 is a diagram depicting a variable resistor of an internal power supply level detection circuit.

As shown in FIG. 3, the variable resistor 38 is comprised of a plurality of resistors 15 connected in series, a plurality of switches 16 placed between a connection point of each resistor and an output terminal B, and a decoder 14 for controlling the switches 16. Data recorded in the fuse circuit 5 is input to the decoder 14. The output of the decoder 14 turns one of the switches ON based on the data recorded in the fuse circuit 5.

The VBB internal power supply level detection circuit 8 and VBB internal power supply pump circuit 9 are structured in the same way as the VNN internal power supply level detection circuit 6 and the VNN internal power supply pump circuit 7.

(2) Operation Principle

The principle of suppressing a restore failure and off leak current failure by the present invention will now be described.

(i) Suppression of Restore Failure

Suppression of a restore failure will be described first.

Out of a refresh cycle, a period when the sense amplifier is activated and the capacitor 103 is charged will be considered. In other words, a period when the bit line 105 has a higher potential than the capacitor 103 will be considered.

Figure 20:
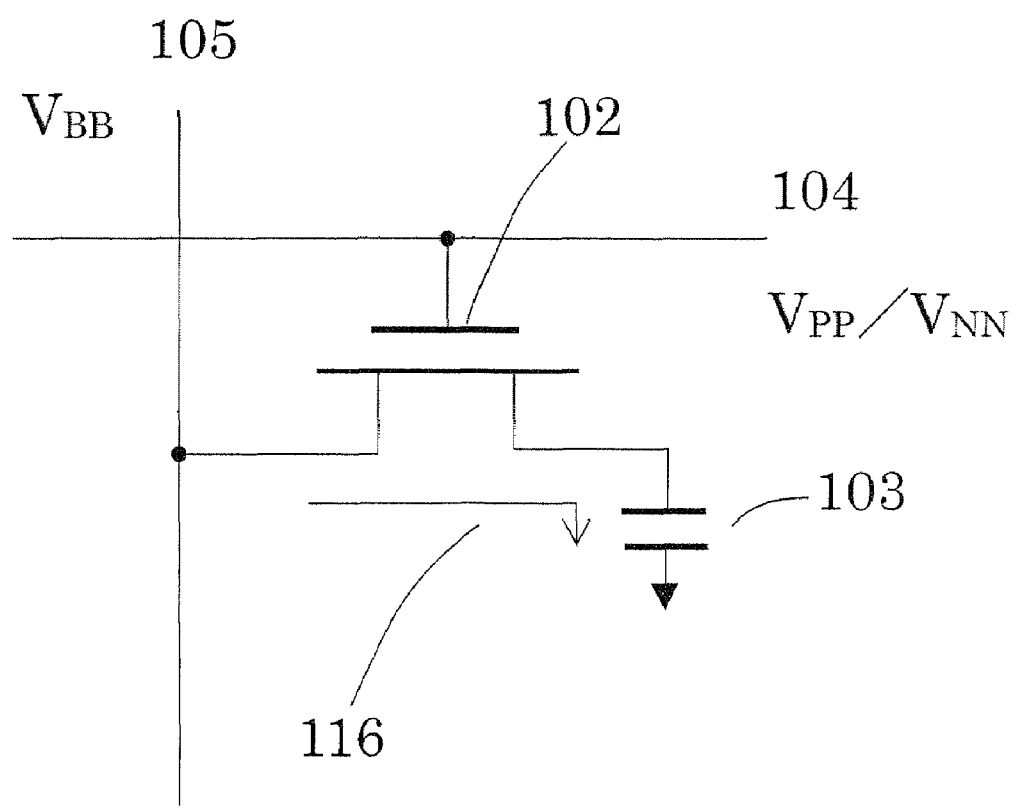
FIG. 20 is a circuit diagram of a memory cell depicting refresh.
Figure 21:
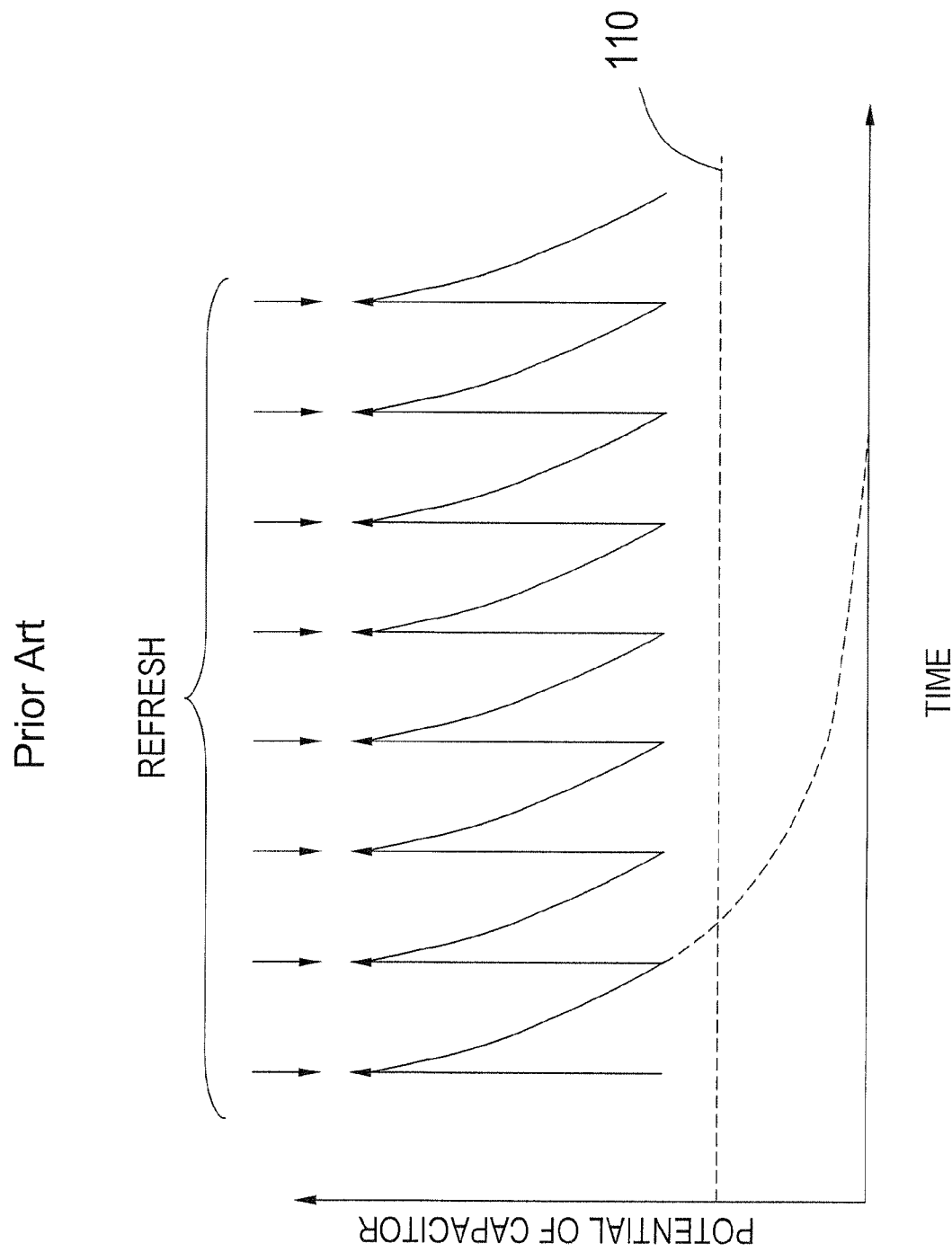
FIG. 21 is a diagram depicting the refresh operation.
Figure 22:
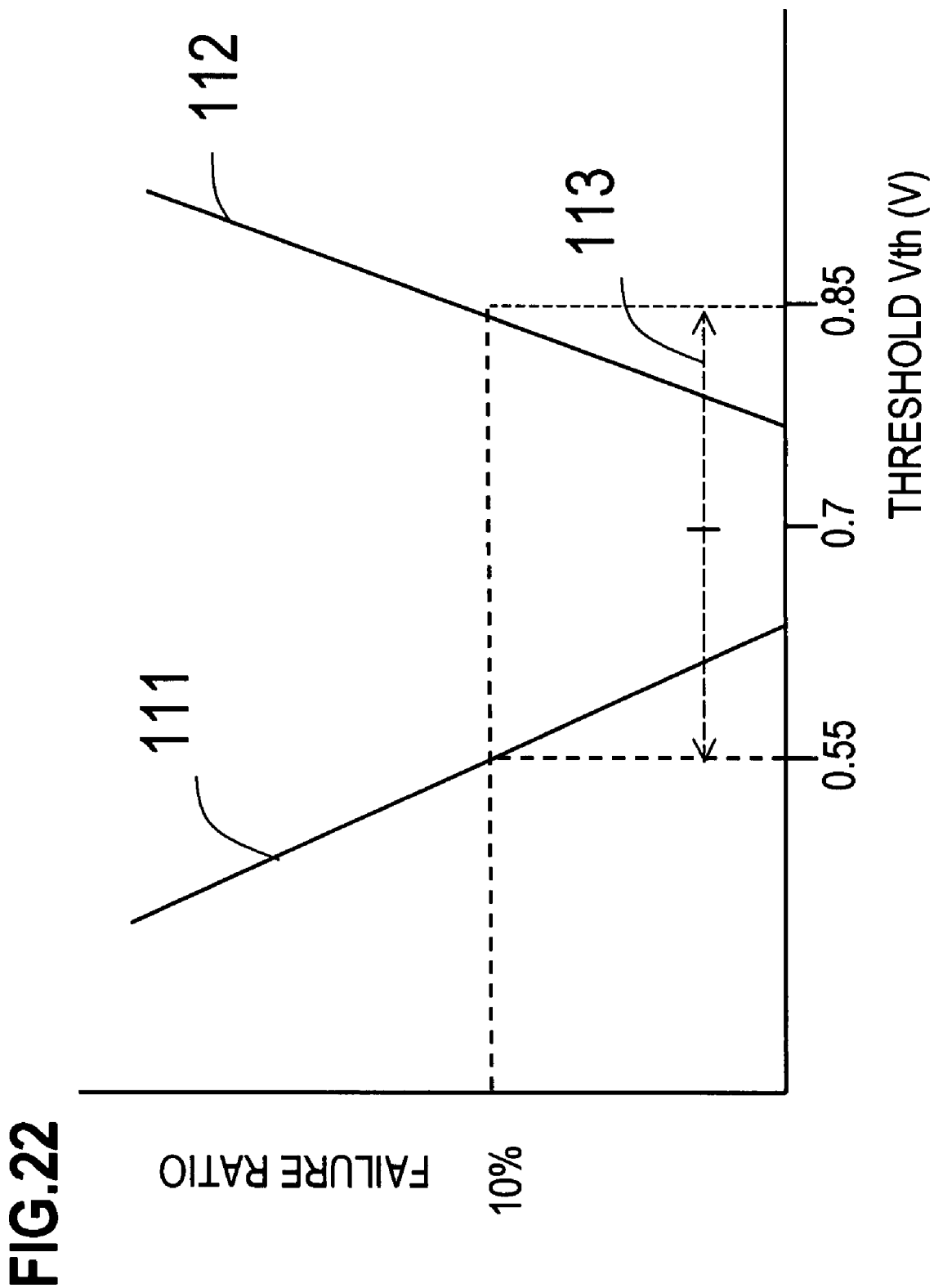
FIG. 22 is a diagram depicting a failure cell generation ratio with respect to a threshold Vth of a cell transistor.
Figure 23:
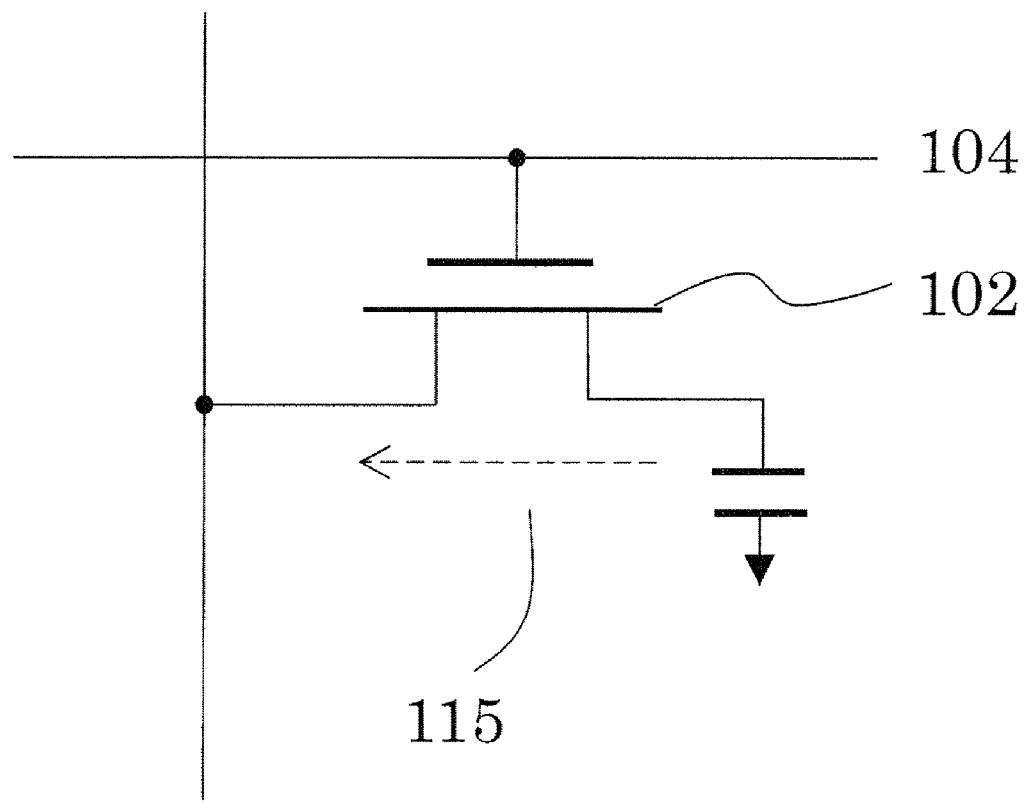
FIG. 23 is a circuit diagram of a memory cell depicting off leak current.
Figure 24:
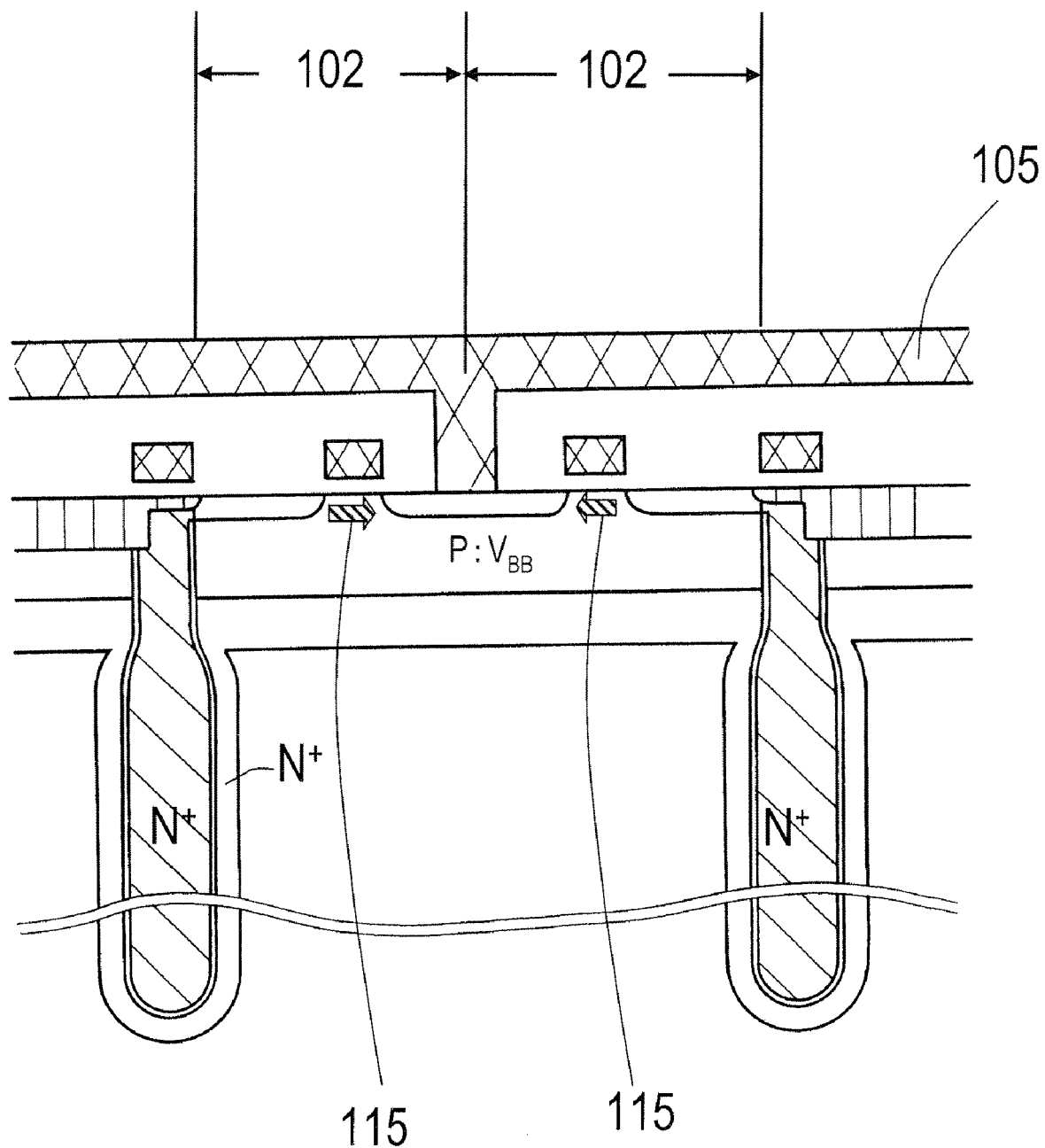
FIG. 24 is a cross-sectional view of a memory cell depicting off leak current.
Figure 25:
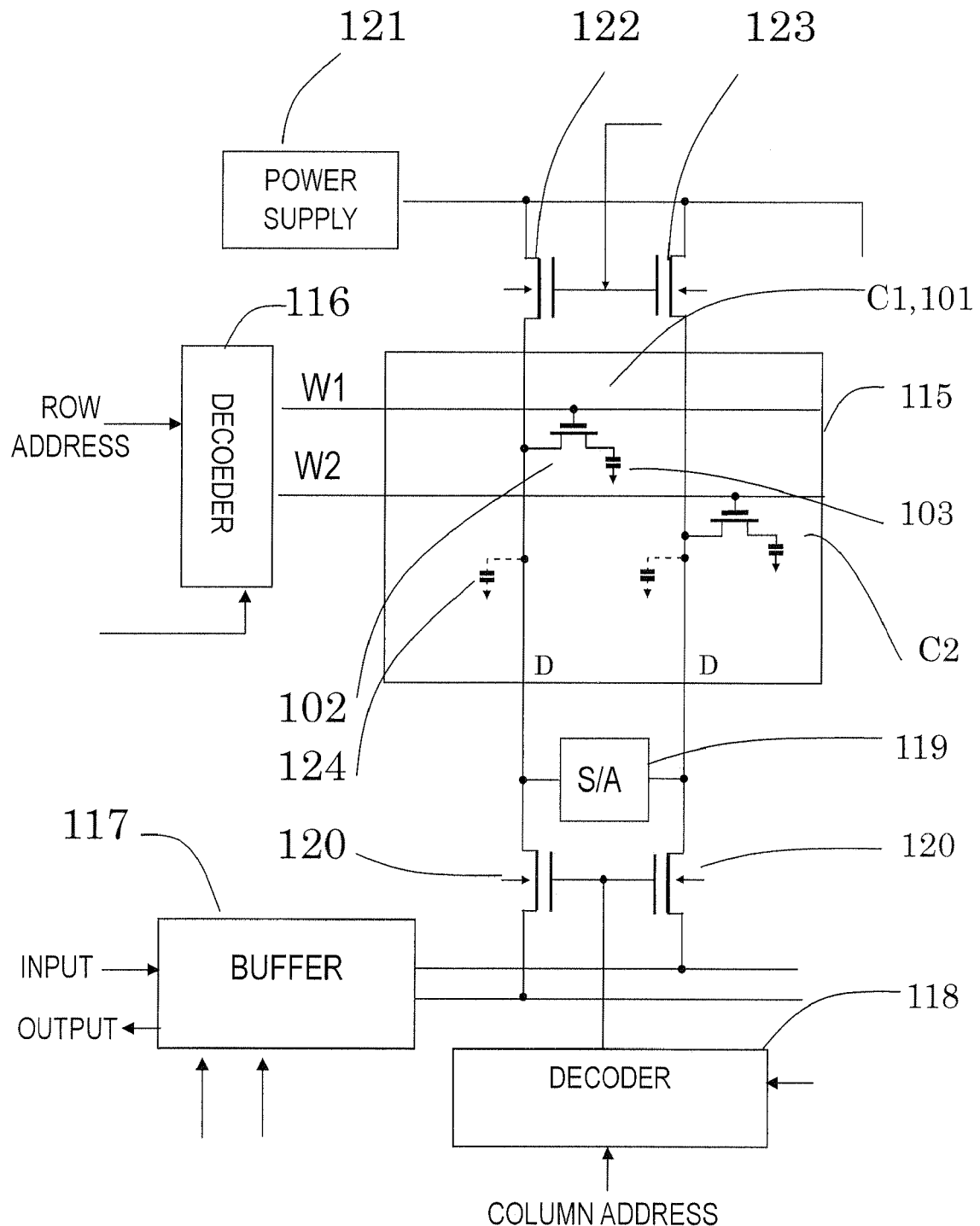
FIG. 25 is a circuit diagram depicting a folded bit line type DRAM.
Figure 26:
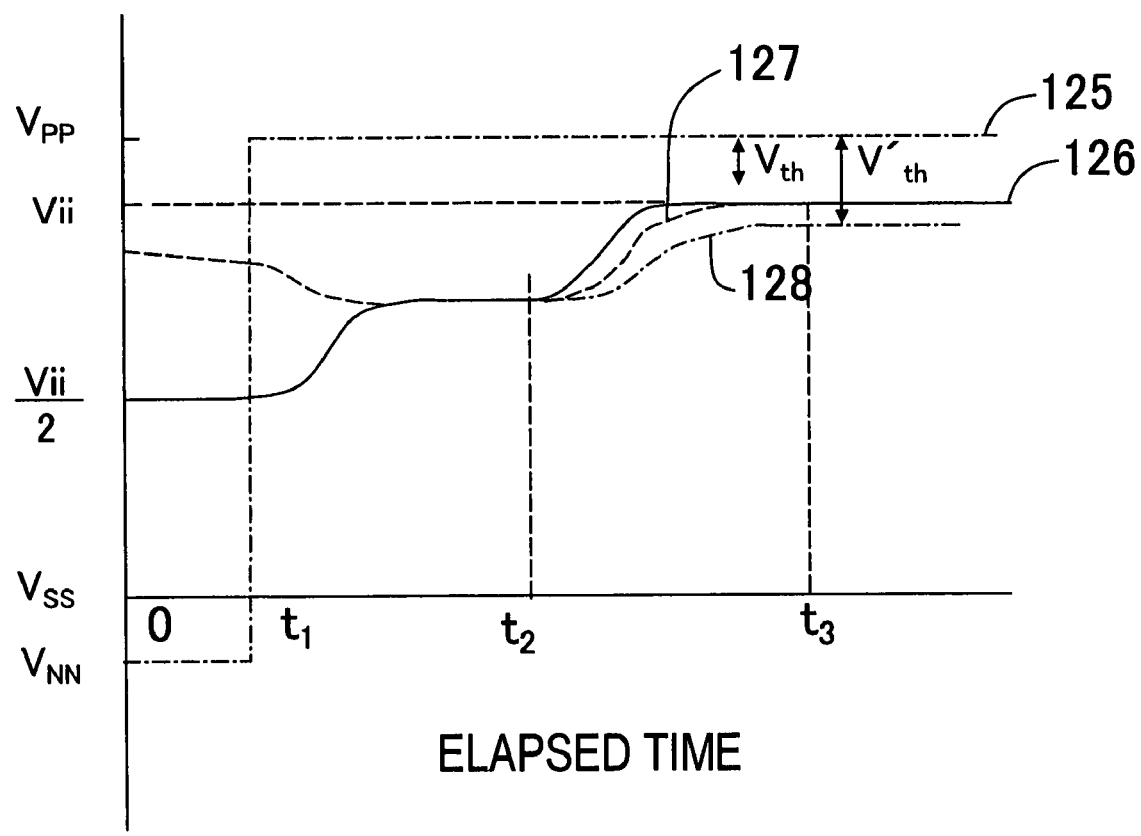
FIG. 26 is a diagram depicting time-based change of capacitor potential in the refresh operation.
Figure 27:
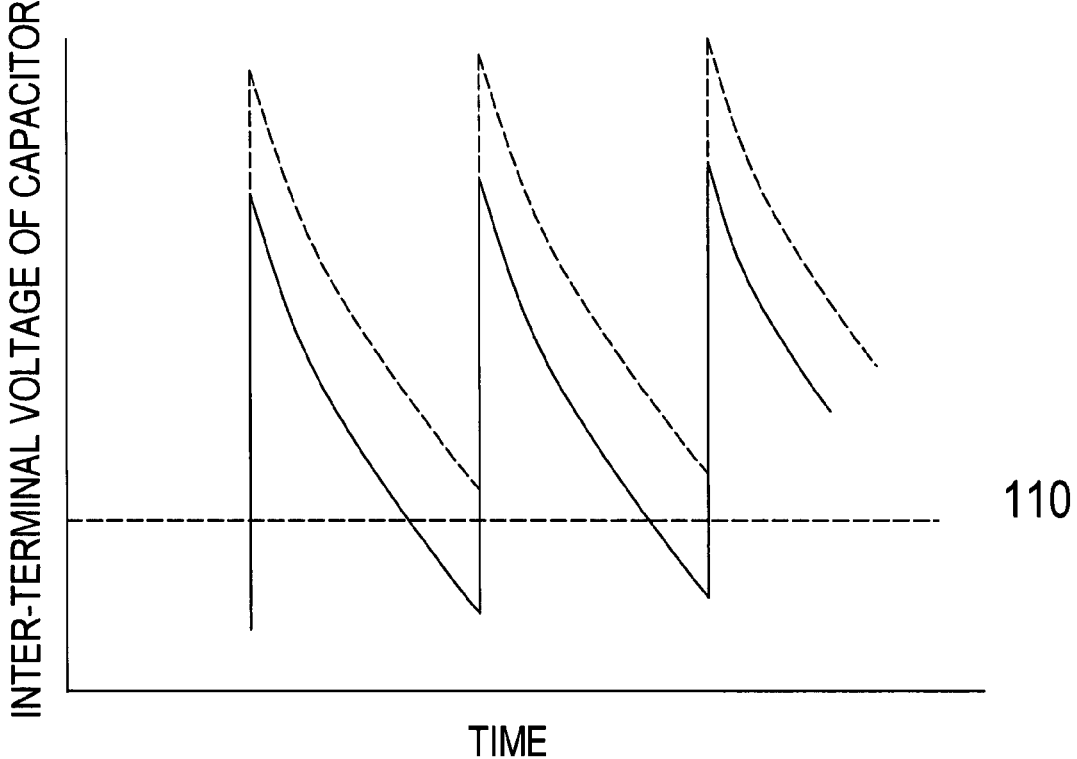
FIG. 27 is a diagram depicting the restore failure.
Figure 28:
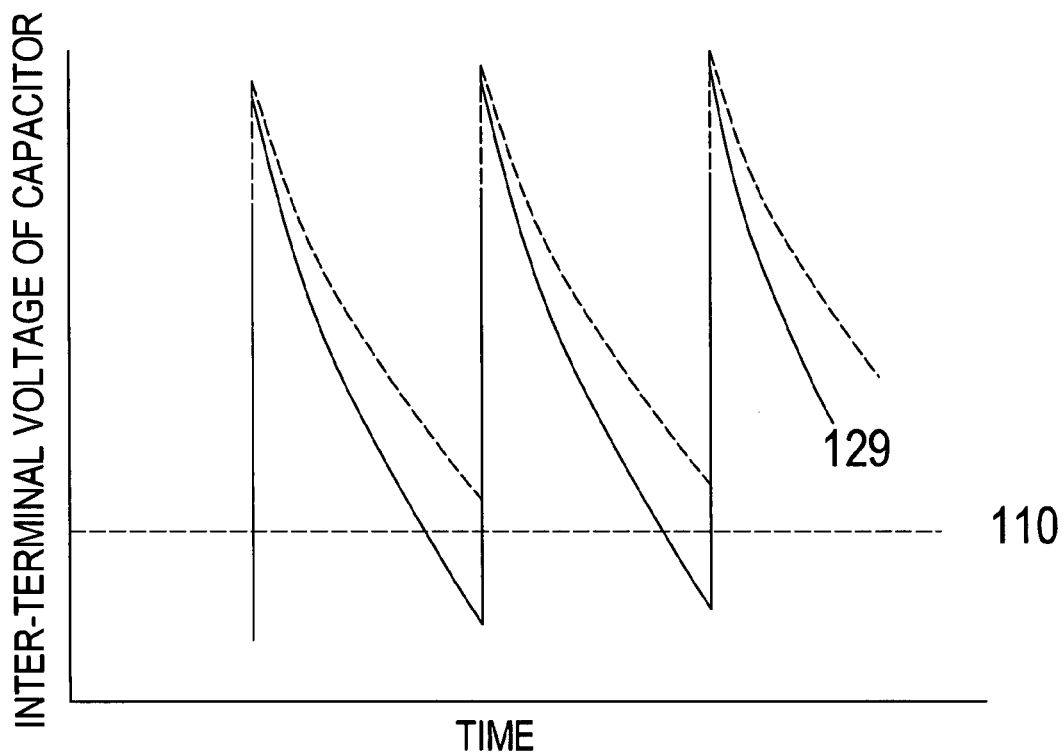
FIG. 28 is a diagram depicting the off leak current failure.

When a potential difference (Vgs) between <word line set potential Vpp> and <potential of the source-drain region at the capacitor side> is greater than the threshold Vth of the cell transistor 102, the cell transistor 102 turns ON (see FIG. 20). As long as this state continues, the capacitor 103 keeps on continuously from being charged.

Therefore even if the threshold Vth of the cell transistor 102 becomes a value greater than the target value (Vth') due to dispersion in the fabrication process, the cell transistor 102 never turns OFF before the potential of the capacitor reaches a design value (=internal potential Vii) only if the word line setting potential Vpp is set sufficiently high (Vpp>Vii+Vth'). In this case, a restore failure is not generated even if the threshold Vth becomes greater than the target value.

Figure 4:
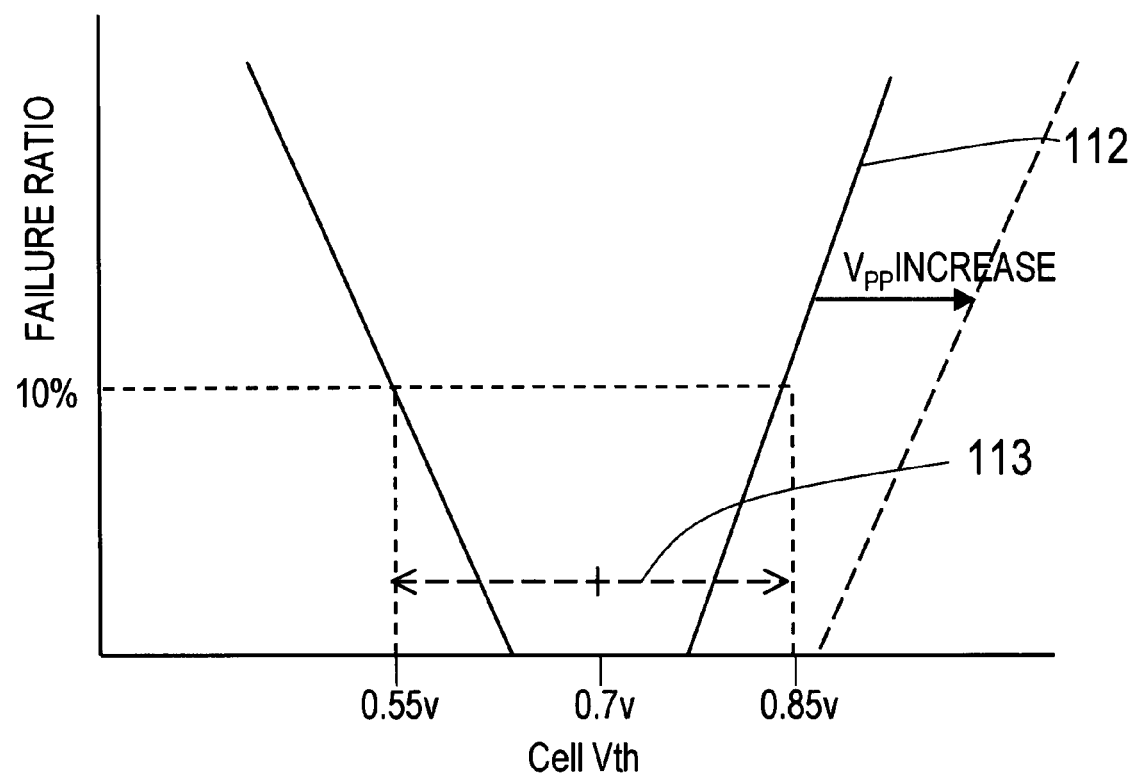
FIG. 4 is a diagram depicting a method for suppressing the restore failure due to an increase of VPP.

Therefore if the word line setting voltage Vpp is set high, the line 112 which indicates the generation ratio of restore failure can be shifted to the high potential side, as shown in FIG. 4. If this shift amount exceeds the line 113 which indicates the dispersion of threshold Vth of the cell transistor, DRAM chips which cause restore failure are not produced.

However a problem of this method is that an electric field higher than the dielectric breakdown strength is more likely to be applied to the gate oxide film. If dielectric breakdown occurs the gate oxide film, current flows into the gate oxide film, which is supposed to be an insulation film. This problem occurs more easily now since the gate oxide film is thinner because of miniaturization and lower drive voltage.

Even in commercialized DRAMs, gate oxide film thickness is already as thin as 7 nm. When the capacitor in a low level state is refreshed, the large potential difference generated between the word line (where word line setting potential Vpp is applied) and the capacitor (in ground potential Vss) is applied to the gate oxide film. As a result, a large electric field is generated in the gate oxide film. In the case of a gate oxide film of which layer has become thin, this field strength is close to a critical value (60 to 80 MV/m) at which current flows into the oxide film. If current flows into the gate oxide film, operation of the DRAM becomes unstable, and reliability of the DRAM drops dramatically. Therefore this method of increasing the potential of the word line setting potential Vpp cannot be used for the latest DRAMs of which gate oxide film layer is thin.

Therefore in the present invention, the threshold Vth of the cell transistor is decreased by making the back gate potential of the cell transistor shallow in order to suppress the restore failure.

Figure 5:
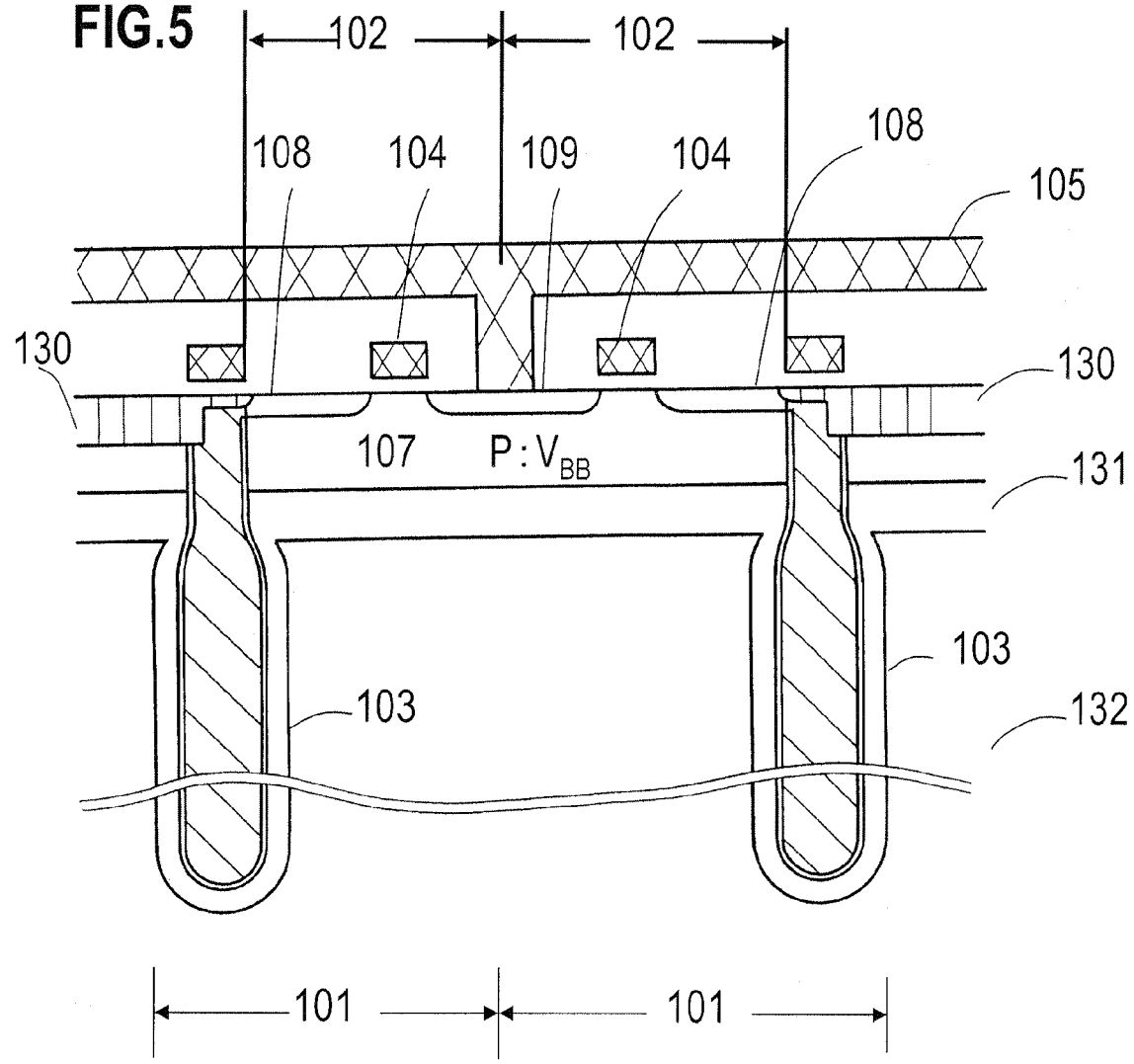
FIG. 5 is a cross-sectional view depicting a memory cell constituting a DRAM.

FIG. 5 is a cross-sectional view of the memory cell 101 constituting the DRAM. FIG. 5 also shows the conduction type of each layer constituting the cell transistor 102 and the potential to be applied. For example, in the back gate region 107, "P: VBB" is indicated, which means the conduction type is a P type, and a back bias potential VBB is applied.

FIG. 5 shows two memory cells 101. A capacitor 103 is a trench type capacitor. In cell transistors 102 constituting each memory cell 101, the source and drain regions are integrated into one region 109. A bit line 105 is connected to this region.

The cell transistor 102 in FIG. 5 is an n-channel MOSFET. Therefore the source-drain regions 108 and 109 are n+ regions. A back gate region 107 is a p-type Si. On a thin gate oxide film which overlies the p-type semiconductor layer between the source-drain regions 108 and 109, a word line 104, which functions as a gate, runs in the vertical direction to the page face. The word line 104 functions as a gate of the cell transistor 102, which is a MOSFET. These memory cells are electrically isolated from the other memory cells by an element isolation layer 130, which is a thick $SiO_2$ film. These memory cells are also electrically isolated from a substrate by a pnp structure which is comprised of the p-type back gate region, n-type internal potential layer 131, and p-type substrate 132. −0.3V is normally applied as a back gate voltage.

In the DRAM, a 0V or less bias potential VBB is applied to the back gate region 107. The potential of the source-drain region line 108 and 109 is always 0V or more. Therefore a back bias is always applied to the pn junction of the source-drain regions 108 and 109 and the back gate region 107. Therefore current which leaks from the source-drain regions 108 and 109 to the back gate region 107 is very little. This current is called a "junction leak".

Figure 6:
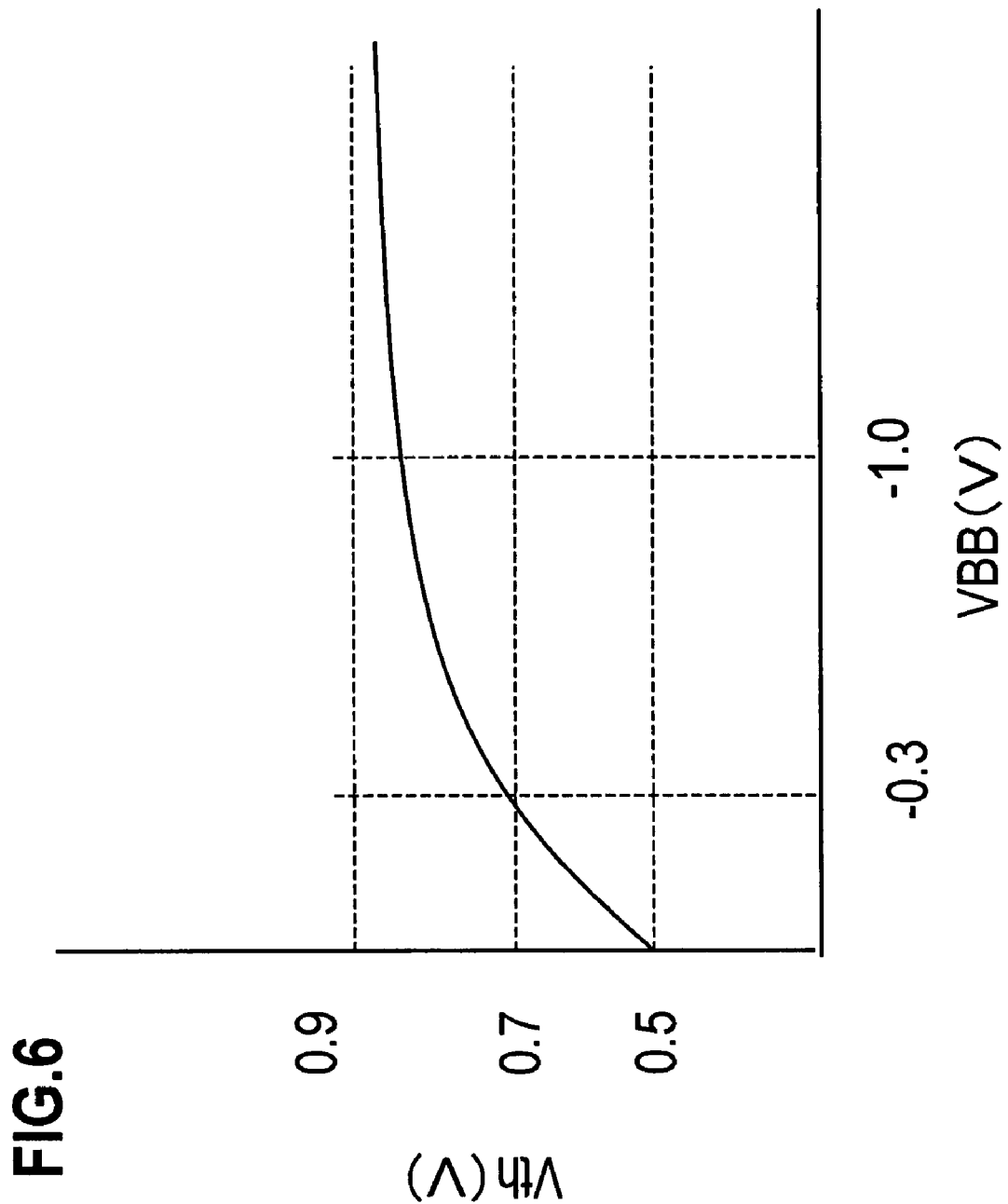
FIG. 6 is a diagram depicting a back gate bias effect.

It is known that the threshold of MOSFET increases if backward voltage is applied to the back gate. This phenomena is called a "back gate bias effect" (Non-patent Document 3). FIG. 6 is an example of the back gate bias effect. The abscissa is a back bias potential VBB and the ordinate is threshold Vth. As the back bias potential VBB become deeper (absolute value of the back bias potential VBB, which is negative, becomes larger), the threshold Vth increases. The change ratio of the threshold Vth is greatest near the ground potential Vss, and in the case of the example in FIG. 6, the saturation tendency becomes conspicuous after around −0.3V.

As mentioned above, normally about −0.3V of back bias potential VBB is applied to the cell transistor 102. If the ground potential Vss is connected to the back gate without applying negative potential, the threshold Vth of the cell transistor 102 is greatly changed even by a slight noise. Therefore in a DRAM, in order to suppress such a change, about −0.3V of back bias VBB, with which change of threshold Vth is at the saturation tendency, is normally applied to the back gate region.

The value −0.3V is sufficiently deep to suppress the influence of noise on the threshold value Vth. Therefore in the present invention, if the threshold Vth is too high, the threshold VBB is decreased by setting the back bias potential VBB shallow (absolute value of back bias potential VBB, which is negative, is set to smaller negative potential). By this as well, the restore failure can be suppressed without the side effect of changes in threshold Vth by noise.

A problem of the mean of suppressing the restore failure by increasing Vpp is that the dielectric breakdown of the gate oxide film more easily occurs. The mean of setting back bias potential VBB shallow has no such problem.

The maximum field strength to be applied on the gate oxide film is determined by the potential difference between the word line 104 and the source-drain regions 108 and 109. The potential of the word line 104 and the potential of the source-drain regions 108 and 109 are determined by the power supply each is connected to (or potential of the capacitor 103), regardless the back bias potential VBB. Therefore even if the back bias potential VBB is set shallow, the field strength to be applied to the gate oxide film does not change. So dielectric breakdown of the gate oxide film does not easily occur.

Figure 7:
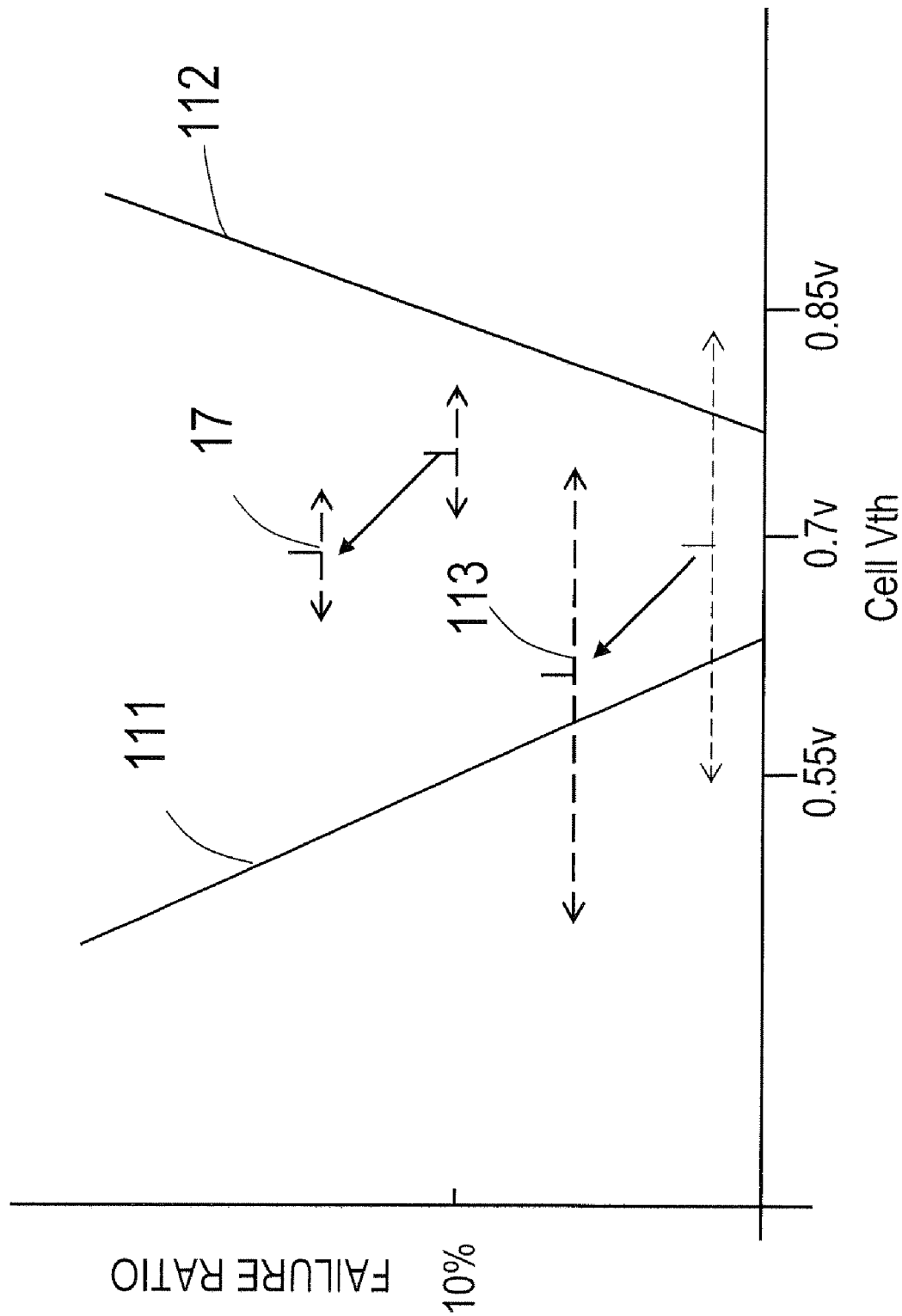
FIG. 7 is a diagram depicting a method of suppressing a restore failure by setting the back bias shallow.

If the back bias potential VBB is set shallow, the line 113, which indicates the dispersion of the threshold Vth, shifts to the low potential side, as shown in FIG. 7. Therefore the range in which the threshold Vth of the cell transistor disperses (line 113) moves away from the region where the restore failure rapidly increases (region where line 112 rises). However the range in which the threshold Vth disperses deeply enters the region where off leak current failure becomes conspicuous (region where line 111 rises).

In the present invention however, the threshold Vth of the cell transistor is estimated for each DRAM chip, and the back bias potential VBB is set shallower than the design value only if the estimated value is high. Therefore DRAM does not cause an operation failure by the off leak current failure.

The dispersion of the threshold Vth (line 113) shown in FIG. 7 is a dispersion of the threshold Vth of all the cell transistors fabricated in the same fabrication process. However a dispersion 17 of the threshold Vth within the same DRAM chip is much smaller than this. So if a threshold Vth of a cell transistor is determined for each DRAM chip, and the back bias potential VBB is set shallow based on this value, the threshold Vth does not enter the region where off leak current failure radically increases, as shown in FIG. 7. Therefore even if the back bias potential VBB is set shallow, off leak current failure does not occur.

(ii) Suppression of off Leak Failure

Figure 8:
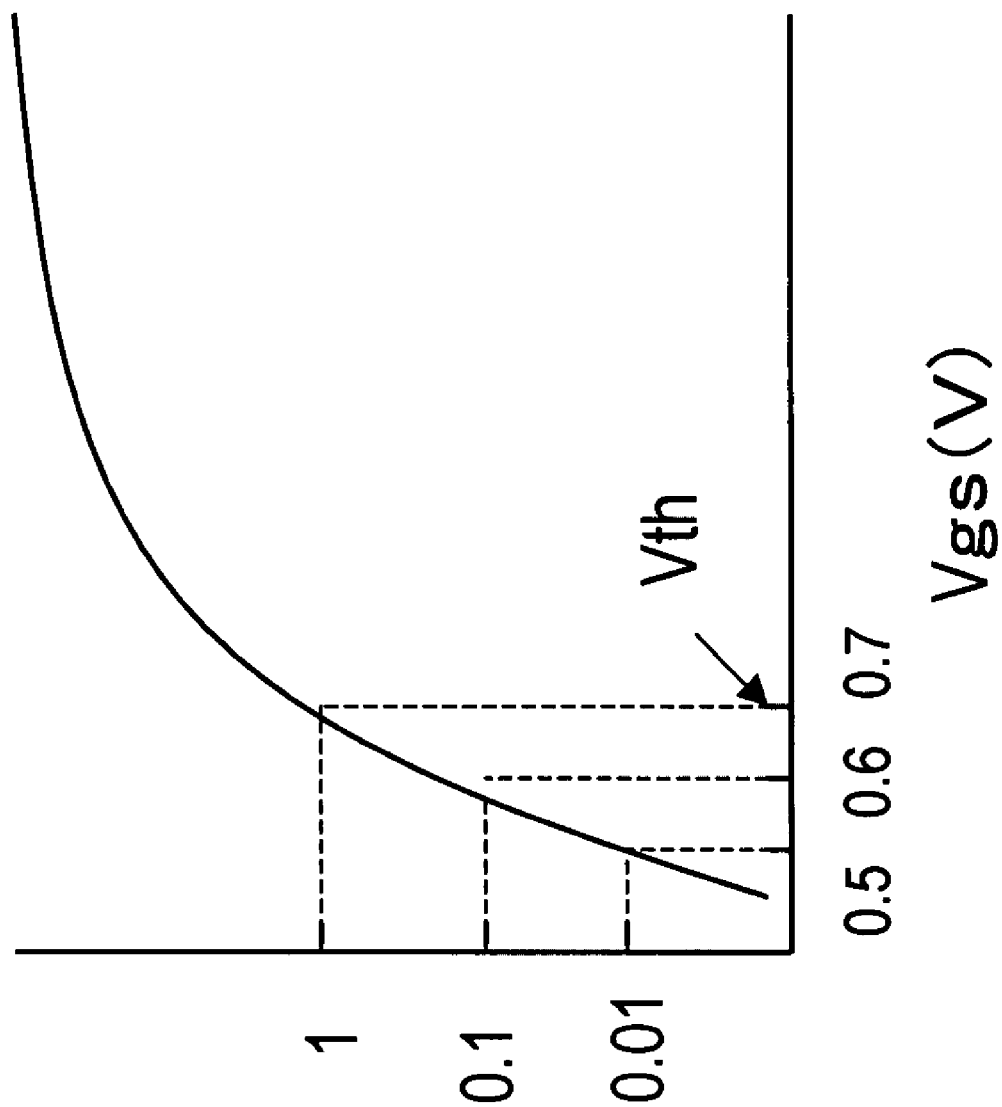
FIG. 8 is a diagram depicting drain current with respect to the voltage between the gate and source of MOSFET.

Now suppression of off leak current failure will be described. The drain current ID of MOSFET decreases one digit if the voltage Vgs between the gate and source decreases 0.1V in the regeion where Vgs is the threshold Vth or less, as shown in FIG. 8 (drain current ID is an exponential function of which variable is Vgs-Vth). Therefore the off leak current can be easily decreased if the word line non-selecting potential VNN is set deep. Setting the word line non-selecting potential VNN deep means moving the word line non-selecting potential VNN in the direction of negative potential. Setting it shallow means the opposite thereof. If the word line non-selecting potential VNN is set deep, the line 111, which indicates off leak current failure, can be shifted to the low voltage side (in an actual DRAM, the word line non-selecting potential VNN is a negative value, so Vgs is a negative value. Even if Vgs is negative, however, the tendency is the same as observed in FIG. 8.)

Therefore in the present invention, the threshold Vth of the cell transistor is determined for each DRAM chip, and the word line non-selecting potential VNN is set deep only when the acquired threshold Vth is lower than the target value.

(3) Cell Monitor Vth Detection Circuit

Figure 10:
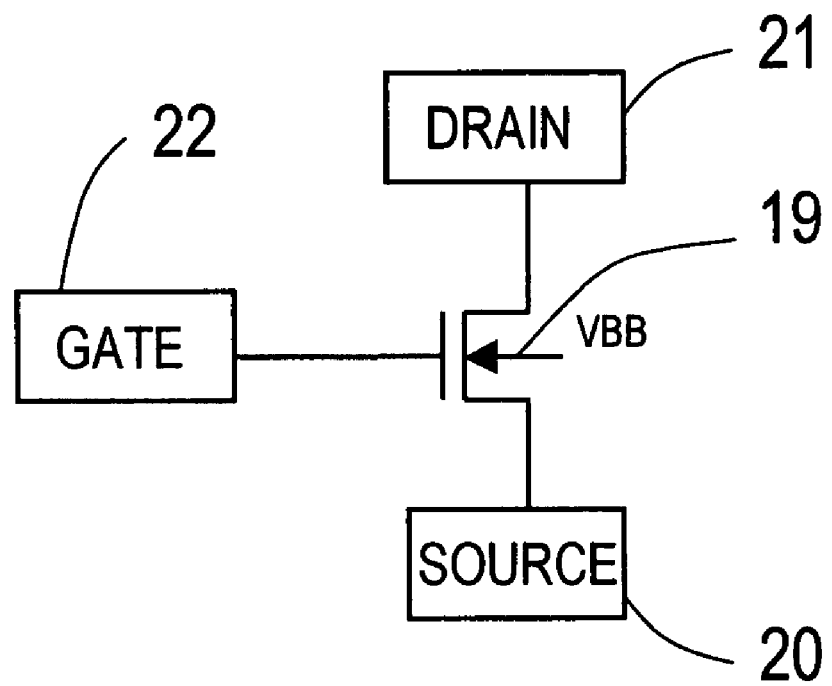
FIG. 10 is a conceptual diagram depicting a cell monitor Vth detection circuit.

FIG. 10 is a basic structure of the cell monitor Vth detection circuit.

A MOSFET 19 has a structure identical to a cell transistor on the same chip and is fabricated in the same fabrication process as the cell transister. A threshold Vth of the MOSFET 19 is measured from outside the DRAM, and the value is estimated as a threshold Vth of a cell transistor constituting a cell array 1. Since the MOSFET 19 has a structure identical to the cell transistor and is fabricated in the same fabrication process as the cell transistor, it can be estimated that their thresholds Vth are the same.

A source, drain and gate of the MOSFET 19 are connected to electrode pads to which a probe of an LSI tester (tester for integrated circuits) can contact respectively. The electrode pads to which the source, drain and gate are connected are called source terminal 20, drain terminal 21 and gate terminal 22 respectively.

The MOSFET 19 must physically have the same structure as the cell transistor, and must be fabricated in the same process as the cell transistor. For this, a circuit having a structure as similar as possible with the cell array is fabricated together with the cell array, and a MOSFET having the same structure as the cell transistor is included there.

Figure 11:
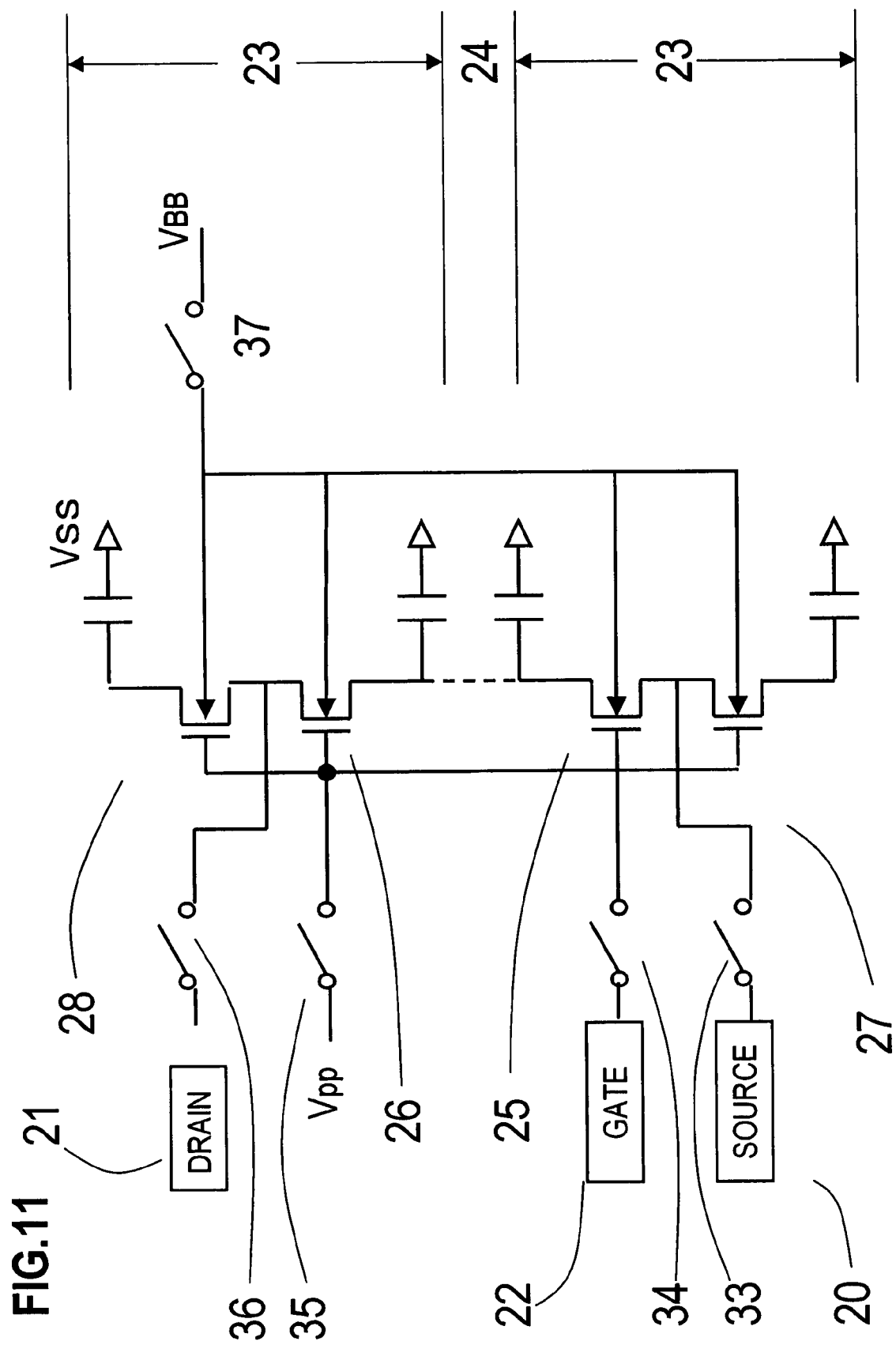
FIG. 11 is a detailed circuit diagram depicting the cell monitor Vth detection circuit.
Figure 12:
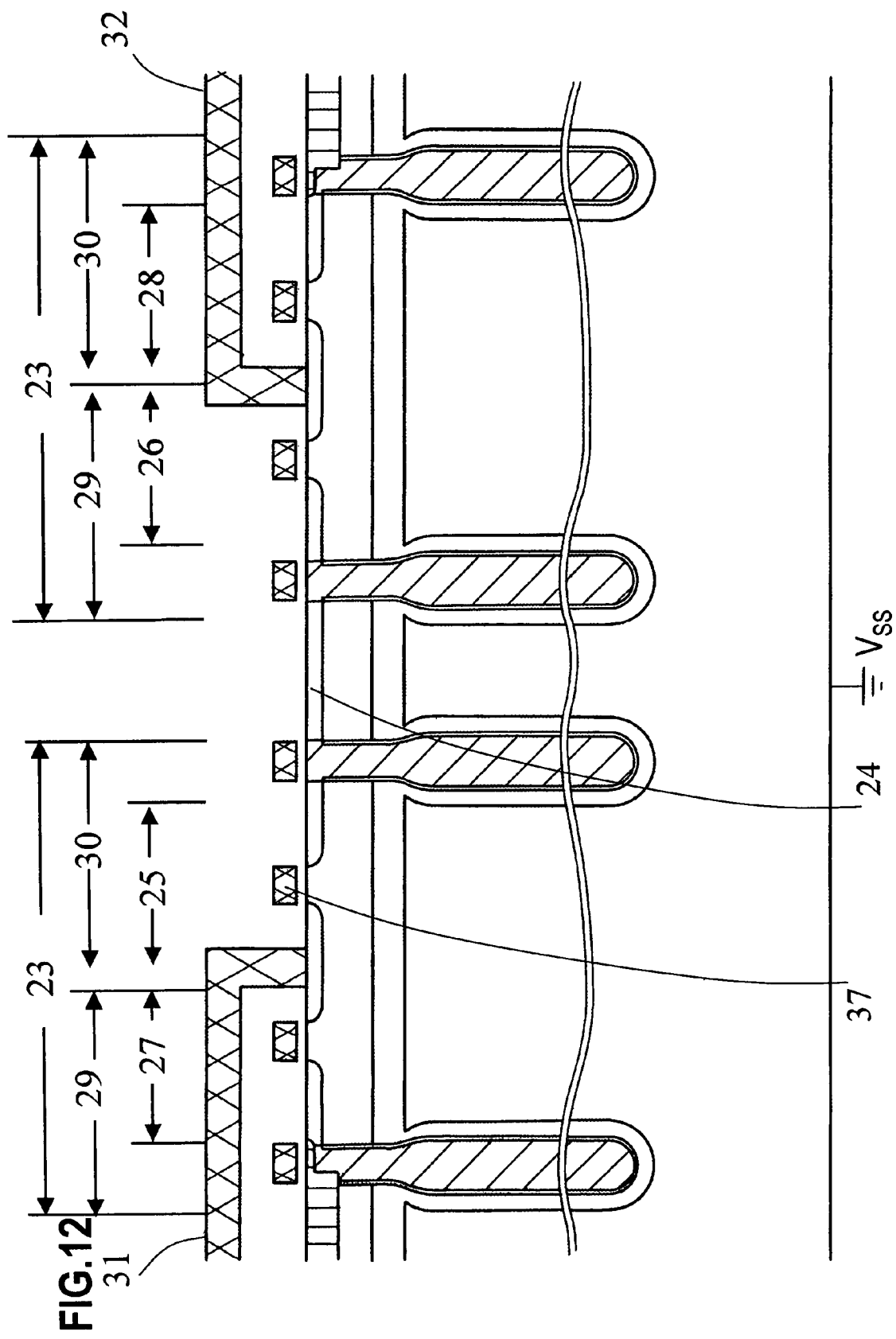
FIG. 12 is a cross-sectional view depicting the cell monitor Vth detection circuit.

FIG. 11 is a more detailed circuit diagram of the cell monitor Vth detection circuit. FIG. 12 is a cross-sectional view of elements shown in this circuit diagram. In the cell monitor Vth detection circuit, as shown in FIG. 12, a basic unit 23 of a cell array, which is comprised of two memory cells 29 and 30 integrated in a source-drain region, is further integrated with another basic unit 23 in a connection region 24, which is an n+ layer.

An element of which threshold Vth is measured is one of the two MOSFETs 25 and 26 existing inside. To the gates of the other MOSFET 26 and the MOSFETs 27 and 28 existing outside, a word line setting potential Vpp is applied via a switch 35 during measurement of the threshold Vth. Also, in order to electrically conduct the drain of the MOSFET 25 and drain terminal 21, the word line setting potential Vpp is applied to the gate of the MOSFET 26 too, during the measurement of the threshold Vth, so that the MOSFET 26 is turned ON. The MOSFETs 27 and 28 outside are not related to the measurement of the threshold Vth. But it is not desirable to leave the gates thereof in a floating state, so the word line setting potential Vpp is applied to them during the measurement. To the back gates of the MOSFETs 25, 26, 27 and 28, which are connected to the VBB internal power supply pump circuit 7 via the switch 37, a desired back bias is applied during the measurement of the threshold Vth. The source of the MOSFET 25 is connected to the interconnect 31, which corresponds to the bit line of the cell array, and is finally connected to the first data input/output line of the DRAM chip via the switch 33. In the same manner, the drain of the MOSFET 25 is connected to the second interconnect 32, which corresponds to a bit line, via the MOSFET 26 which is in ON state and the switch 36, and is finally connected to the second data input/output line of the DRAM chip. The interconnects 31 and 32 are interconnects corresponding to one bit line, which is separated on the MOSFETs 25 and 26. The interconnect 37, which corresponds to the word line of the MOSFET 25, is finally connected to the word line of the DRAM chip via the switch 34.

By this configuration, the bonding pads of the data input/output line of the DRAM chip can function as a source terminal and drain terminal. Also the bonding pad of the word line of the DRAM chip can function as a gate terminal.

Switches 33, 34, 35, 36 and 37 are closed during the measurement of the threshold Vth, and are opened when the measurement is over. This is for disconnecting the cell monitor Vth detection circuit from the other configuration of the DRAM chip, so as not to interrupt normal operation of the DRAM after starting the use of the DRAM as a storage device.

Figure 9:
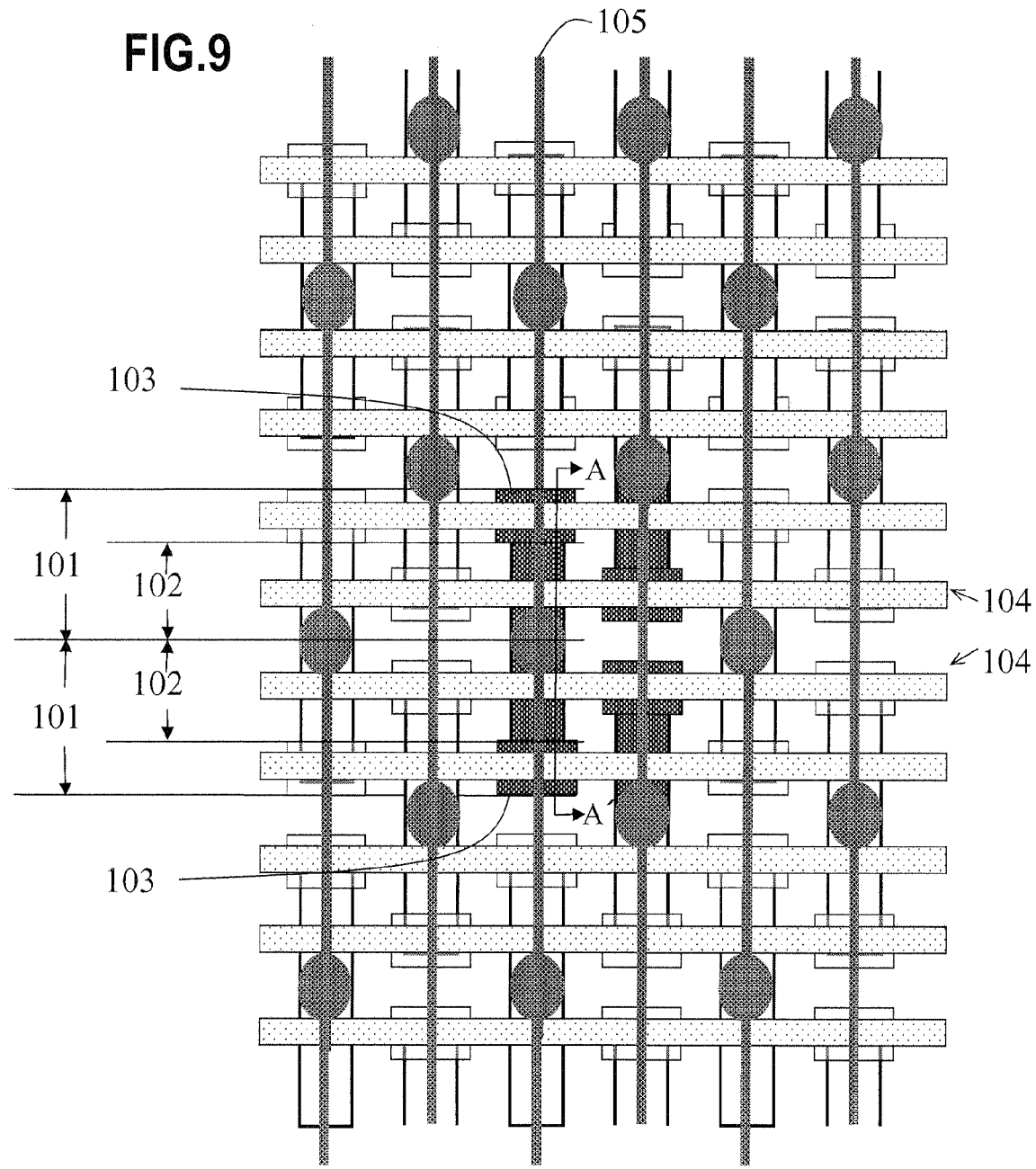
FIG. 9 is a plan view depicting a folded bit line type DRAM.
Figure 13:
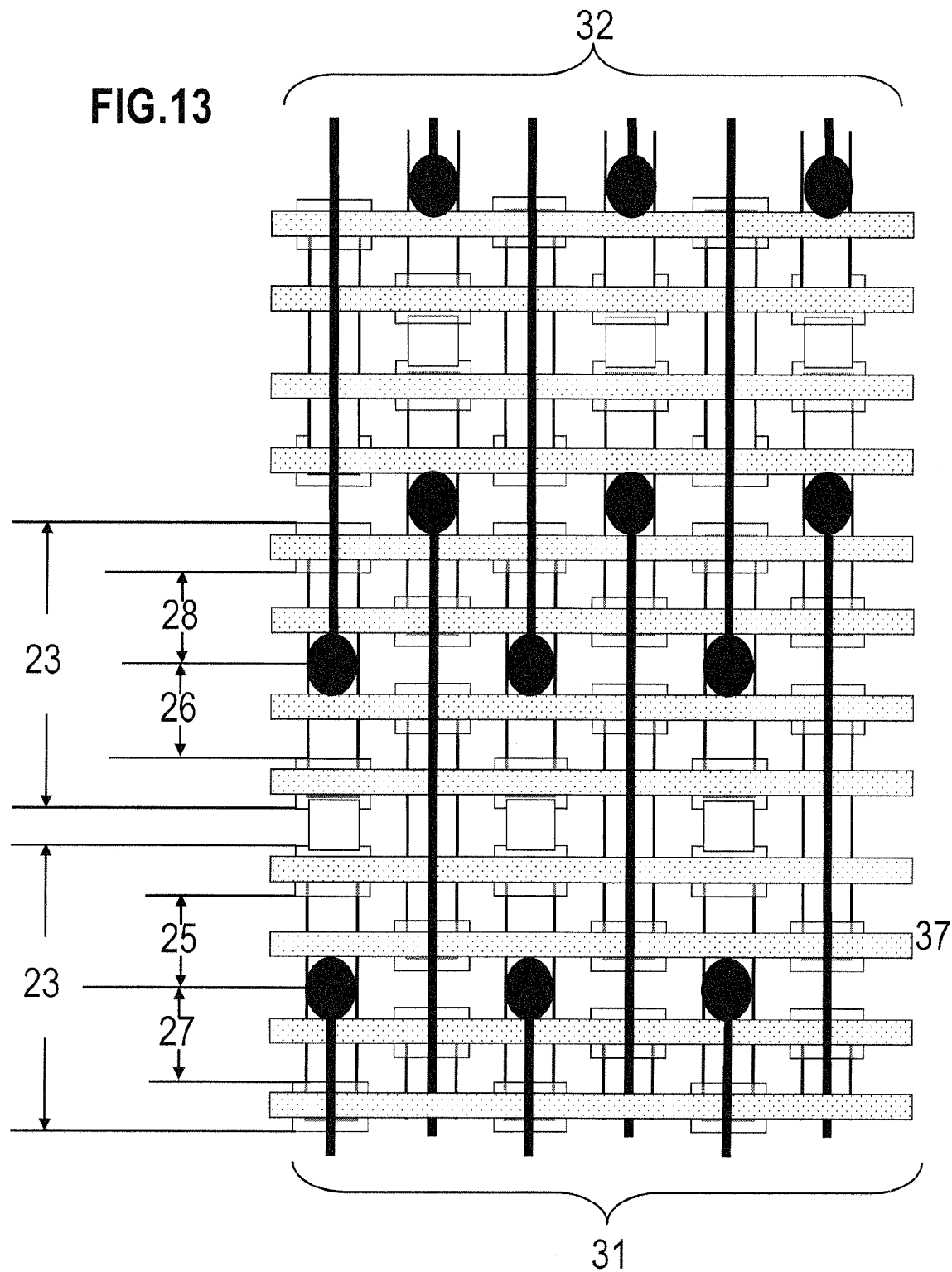
FIG. 13 is a plan view depicting the cell monitor Vth detection circuit.

FIG. 13 is a plan view of the cell monitor Vth detection circuit. The cross-sectional view thereof is shown in FIG. 12. The cell monitor Vth detection circuit is fabricated as the cell array circuit of the folded bit line type DRAM shown in FIG. 9 only with minimum modification.

FIG. 13 shows many MOSFETs 25, 26, 27 and 28 and interconnects 31, 32 and 37 thereof. The interconnects 31, 32 and 37 are mutually connected, although this is not shown in FIG. 13. In other words, many MOSFETs 25 are connected in parallel. This is because the threshold Vth cannot be measured accurately by a single MOSFET 25, since the drain current is too small. The number of MOSFETs 25 which are connected in parallel is 1000, for example. If such a circuit is used, the threshold Vth of many MOSFETs 25 can be simultaneously measured, so an averaged measurement result can be acquired.

A source terminal need not be formed, and the source of the MOSFET 25 may be connected to the ground Vss. The interconnect 37, which corresponds to the word line of the MOSFET 25, may be connected to the VNN internal power supply pump circuit via a predetermined switch. In this case, the gate potential to be applied to the MOSFET 25 is supplied from the VNN internal power supply pump circuit. This predetermined switch as well, is controlled by the test circuit 10 such that it is closed during the threshold Vth measurement and opened after the threshold Vth measurement. The VNN internal power supply pump circuit is also controlled by the test circuit 10 so that a desired potential is applied to the gate.

(4) Operation

Table 1 shows the operation statuses of DRAMs according to the present invention. In table 1, the operation statuses of a plurality of DRAMs with different thresholds Vth are shown.

TABLE 1

Table for describing the operation of the semiconductor device according to the present invention.

| Vth | VNN/VBB (V) | Restore potential before VBB adjustment | Restore potential after VBB adjustment | Off leak current before VNN adjustment | Off leak current after VNN adjustment |
|---|---|---|---|---|---|
| 0.5 | −0.5 | 1.5 | 1.5 | 10 fA | 0.1 fA |
| 0.55 | −0.45 | 1.5 | 1.5 | 3.2 fA | 0.1 fA |
| 0.6 | −0.4 | 1.5 | 1.5 | 1 fA | 0.1 fA |
| 0.65 | −0.35 | 1.5 | 1.5 | 0.32 fA | 0.1 fA |
| 0.7 | −0.3 | 1.5 | 1.5 | 0.1 fA | 0.1 fA |
| 0.75 | −0.25 | 1.45 | 1.49 | 0.032 fA | 0.1 fA |
| 0.8 | −0.2 | 1.4 | 1.475 | 0.01 fA | 0.1 fA |
| 0.85 | −0.15 | 1.35 | 1.46 | 0.0032 fA | 0.1 fA |
| 0.9 | −0.1 | 1.3 | 1.445 | 0.001 fA | 0.1 fA |

The first column from the left shows a threshold Vth of a MOSFET formed in the cell monitor Vth detection circuit, that is an estimated threshold Vth of the cell transistor. The second column shows a word line non-selecting potential VNN and back gate potential VBB determined based on the estimated threshold Vth of the first column. These values are values proven to be effective for suppressing off leak current failure and restore failure in an experiment using another DRAM chip. The word line non-selecting potential VNN and back gate potential VBB determined like this are written in the fuse circuit 5.

The same value is written for the word line non-selecting potential VNN and back gate potential VBB (this value is hereafter called the "VNN/VBB value") Therefore only one fuse circuit 5 is required, and the man hours of the write operation decreases to half since the circuit configuration becomes simplified. For more accurate control, however, two fuse circuits must be formed, where the word line non-selecting potential VNN and back gate potential VBB are written respectively.

The central value 0.7V of the threshold Vth written in the first column of Table 1 is the target value of the threshold voltage Vth in fabricating the DRAM chip. In the case of the DRAM chip of which estimated threshold Vth is 0.7V, the VNN/VBB value −0.3V in the second column in the same row as 0.7V (threshold voltage Vth) is written in the fuse circuit 5. In this case, the potential of the capacitor 103 immediately after being refreshed to a high level (restore potential) is 1.5V (=Vii) written in the third column. The design value of the restore potential is 1.5V. Therefore the capacitor is recharged sufficiently. As a consequence, restore failure is not generated. On the other hand, the off leak current is 0.1 fA written in the fifth column. This value is roughly the same as the standard value 0.1 fA of the junction leak of the cell transistor. In this state, off leak current failure is not generated either.

In the case of a DRAM chip of which estimated threshold Vth is greater than the target value, that is, in the case of a DRAM chip of which estimated threshold Vth is in the bottom half (0.75V to 0.9V) in Table 1, a VNN/VBB value (−0.25V to −0.1V) shallower than the standard value (−0.3V) of back bias is written in the fuse circuit 5 (bottom half of the second column). In the bottom half of the third column, the restore potential (1.45V to 1.3V) when the VNN/VBB value is not adjusted (VNN/VBB value=−0.3V) is shown. In the bottom half of the fourth column, the restore potential (1.49V to 1.445V) of the DRAM chip, where VNN/VBB value (−0.25V to −0.1V) in the bottom half of the second column is written in the fuse circuit 5, is shown. As table 1 shows, in the case of the DRAM chip of which the VNN/VBB value is shallow, the restore potential is close to the target value 1.5V. In such a DRAM chip, the decrease of the restore potential is less than 0.1V, so a restore failure is not generated. However in the case of a DRAM chip of which the VNN/VBB value is not adjusted, a restore failure is generated when the estimated threshold Vth is 0.8V or less.

The off leak current of the DRAM chip of which the VNN/VBB value is set shallow is less than the target value (0.1 fA) as shown in the bottom half of the sixth column. Therefore in the case of a DRAM chip in which a VNN/VBB value in the bottom half of the second column is written in the fuse circuit 5, either a restore failure nor off leak current failure is generated.

In the case of a DRAM chip of which estimated threshold Vth is smaller than the target value, that is, in the case of a DRAM chip of which estimated threshold Vth is in the upper half (0.5V to 0.6V) of Table 1, a deep VNN/VBB value (−0.35V to −0.5V) is written in the fuse circuit 5 (upper half of second column). In the upper half of the fifth column, the off leak current (0.32 fA to 10 fA), in the case when the VNN/VBB value is not adjusted (Vth=−0.3V), is shown. In the upper half of the sixth column, the off leak current (0.1 fA) of a DRAM chip, where the VNN/VBB value (−0.35V to −0.5V) in the upper half of the second column is written in the fuse circuit 5, is shown. As Table 1 shows, in the case of a DRAM chip of which VNN/VBB value is deep, the off leak current recovers to 0.1 fA, which is the same as the target value. Therefore an off leak current failure does not occur. However in the case of a DRAM chip of which VNN/VBB value is not adjusted, a restore current failure is generated when the estimated threshold Vth is 0.65V or less.

The restore potential of a DRAM chip, of which VNN/VBB value is set deep, is 1.5V, which does not cause a restore failure generation problem. Therefore in the case of a DRAM chip where a VNN/VBB value in the upper half of the second column is written in the fuse circuit 5, neither a restore failure nor an off leak current failure is generated.

In other words, in the case of a DRAM chip where threshold Vth of the cell transistor is estimated by the cell monitor Vth detection circuit, a VNN/VBB value is determined based on a correspondence table experimentally defined in advance, and this value is written in the fuse circuit 5, both a restore failure and an off leak current failure are suppressed.

(5) Threshold Vth Estimation Method

Figure 14:
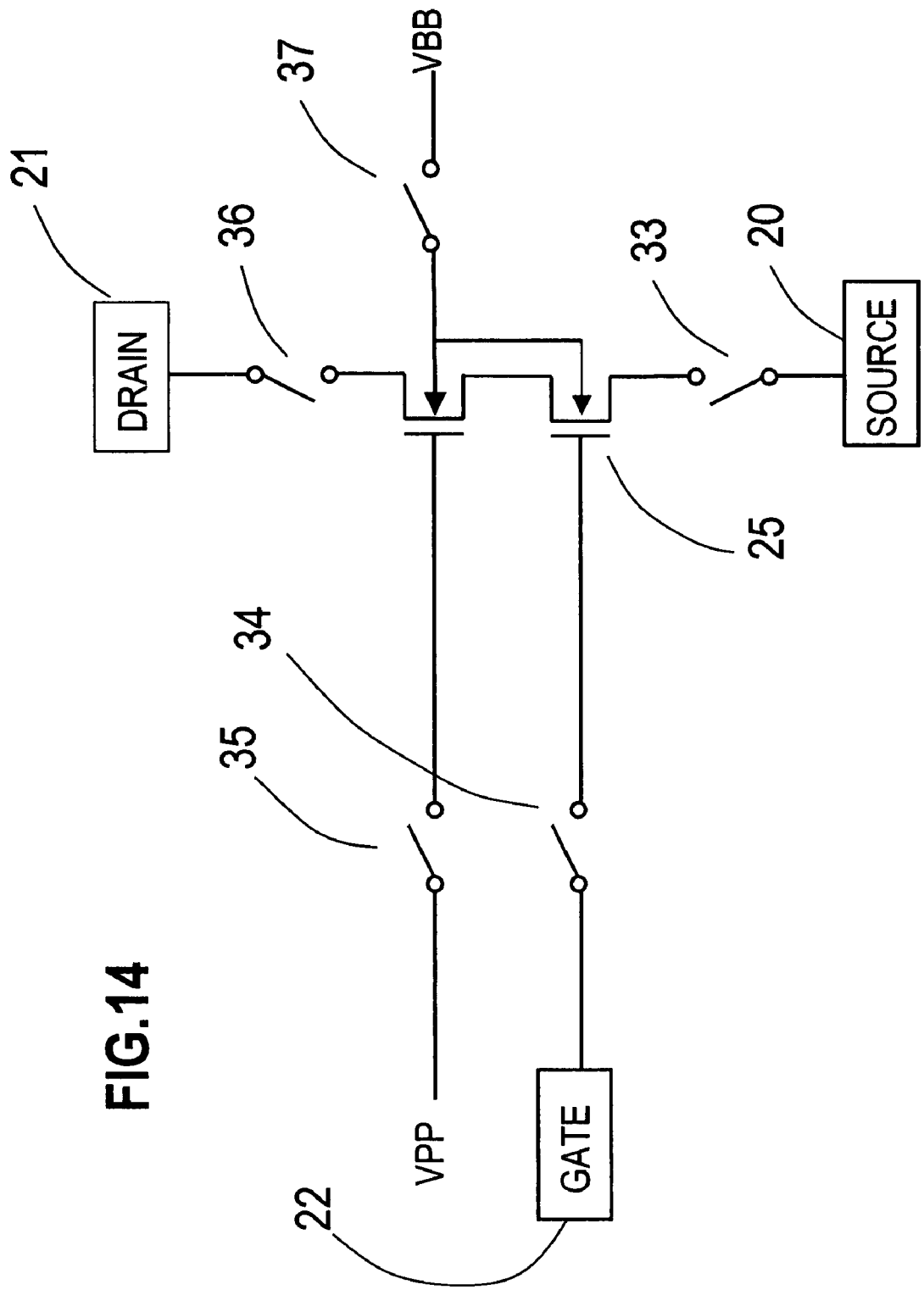
FIG. 14 is a simplified circuit diagram depicting the cell monitor Vth detection circuit.

The threshold Vth of the cell transistor is estimated based on the threshold Vth of the MOSFET 25 formed in the cell monitor Vth detection circuit (FIG. 11 or the simplified one in FIG. 14). The MOSFET 25 in the cell monitor Vth detection circuit and the cell transistor have the same structure, and are fabricated together in the same fabrication process. Therefore it can be estimated that the Vth of both of these thresholds are the same. Accordingly the threshold Vth of the MOSFET 25 formed in the cell monitor Vth detection circuit is measured, and this value is regarded as the threshold Vth of the cell transistor.

Figure 16:
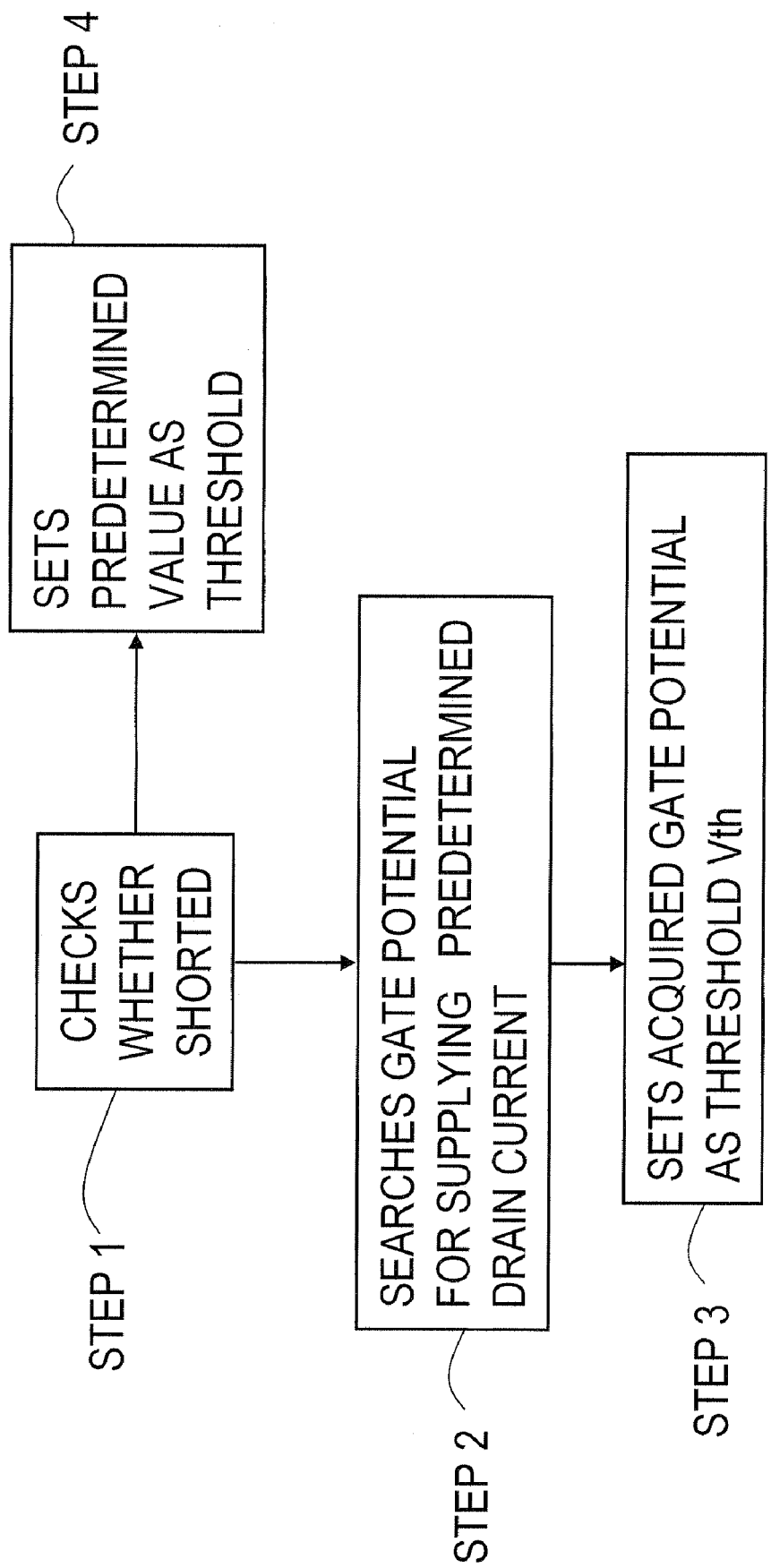
FIG. 16 is a diagram depicting a threshold estimation method for a cell transistor using the cell monitor Vth detection circuit.
Figure 17:
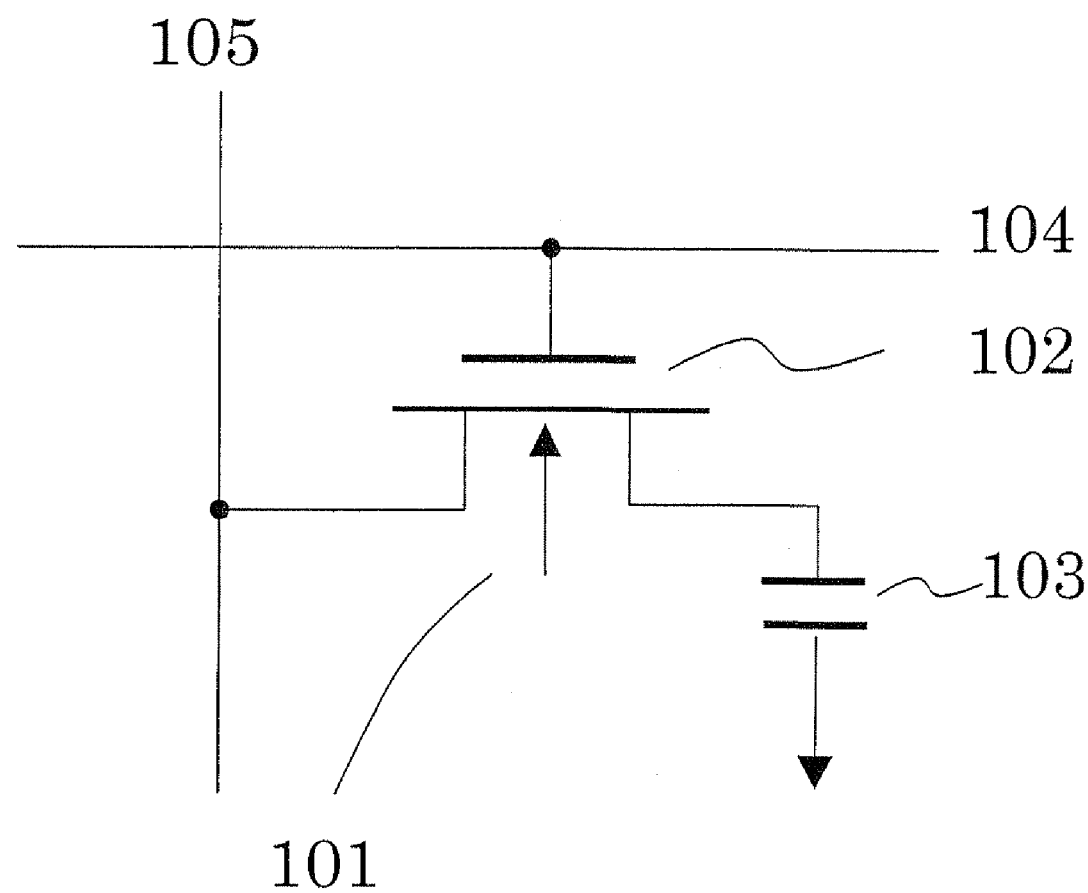
FIG. 17 is a circuit diagram depicting a memory cell.
Figure 18:
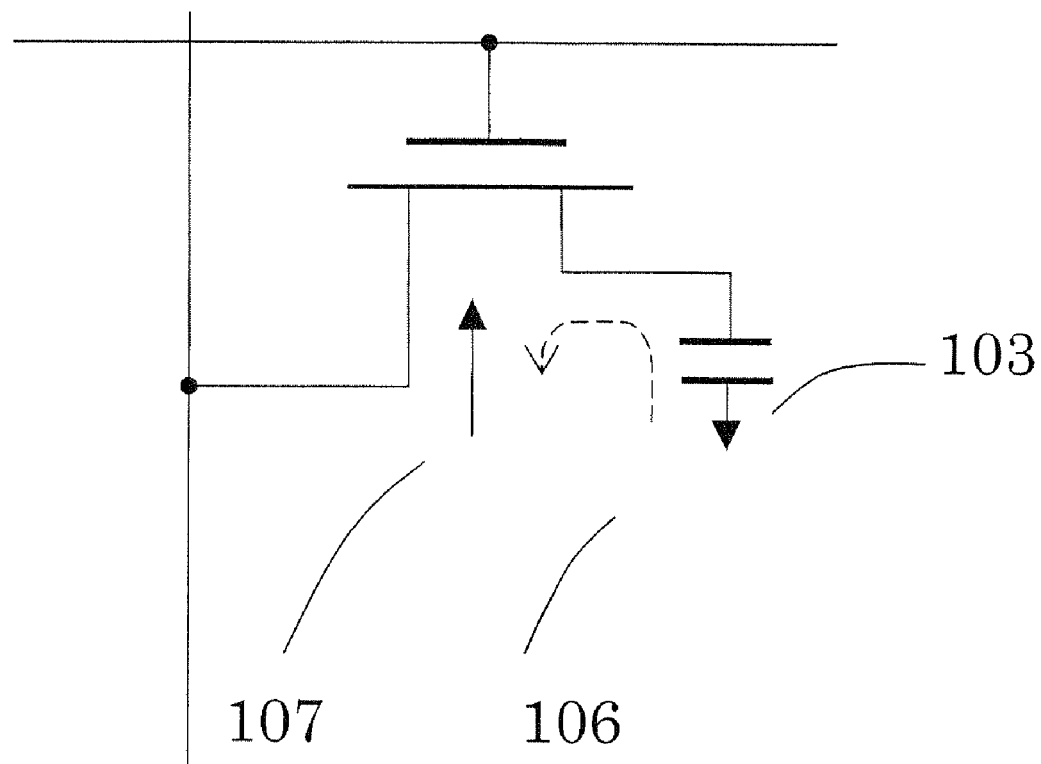
FIG. 18 is a circuit diagram of the memory cell depicting a junction leak.
Figure 19:
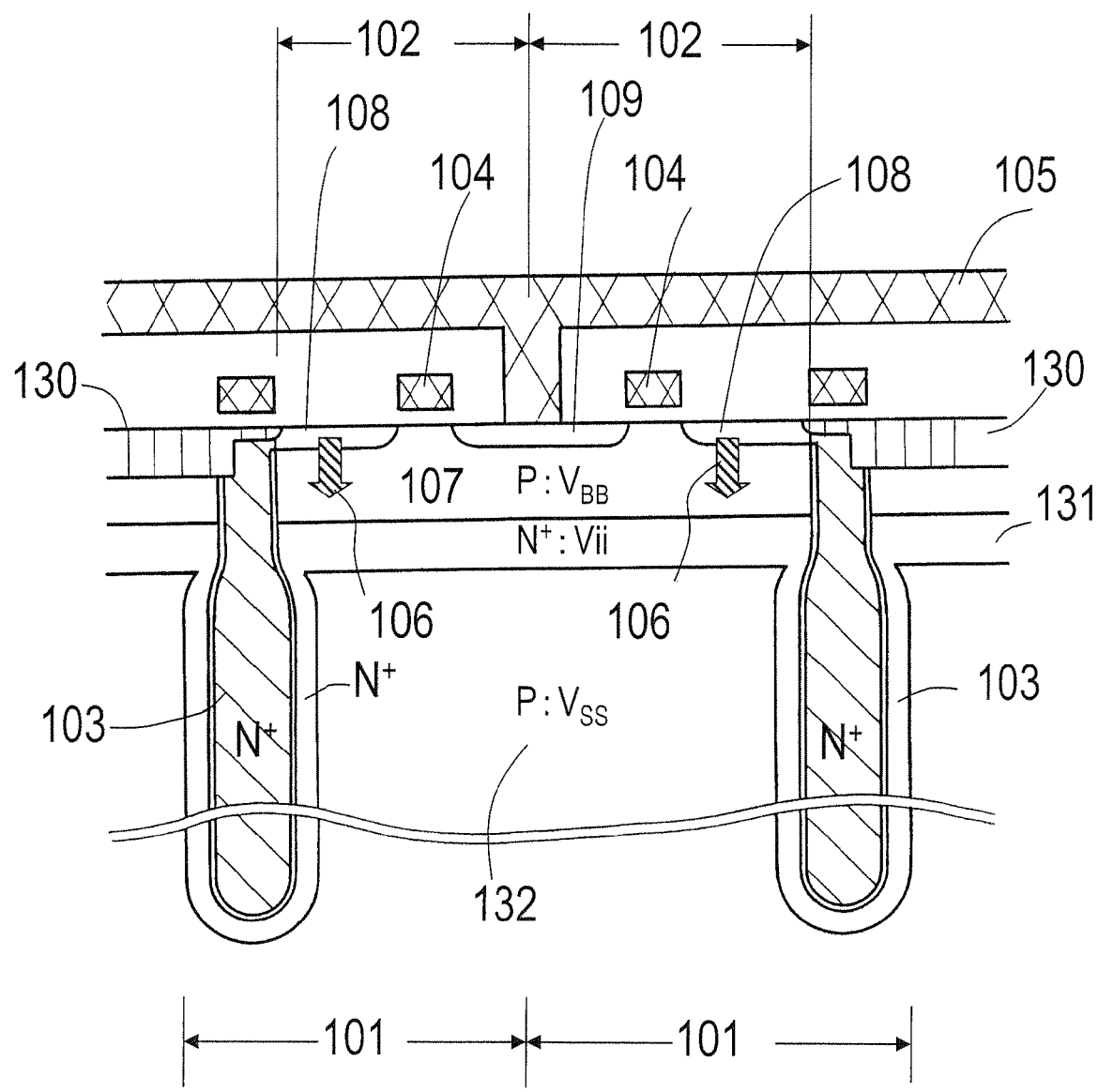
FIG. 19 is a cross-sectional view of the memory cell depicting a junction leak.

Now a method for measuring the threshold Vth of the MOSFET 25 formed in the cell monitor Vth detection circuit (hereafter called "MOSFET for threshold measurement") will be described. FIG. 16 shows a method for measuring the threshold Vth of the MOSFET 25 and estimating it as the threshold Vth of the cell transistor. In the cell monitor Vth detection circuit, it is assumed that 1000 MOSFETs for threshold measurement are connected in parallel. The number of MOSFETs for threshold measurement to be connected in parallel is not limited to 1000, but 10 or more and 100 or less is preferable, 100 or more and 1000 or less is more preferable, and 1000 or more and 10000 or less is most preferable. The number of MOSFETs for threshold measurement may be one.

First a probe of an LSI tester is contacted to the source terminal 20, drain terminal 21 and gate terminal 22 connected to the MOSFET for threshold measurement. Then a command is sent to the test circuit 10, and the switches 33, 34, 35, 36 and 37 are closed. Then a command is sent to the test circuit 10, and the VBB internal power supply pump circuit 7 is started, and the standard value −0.3V of the back bias is applied to the back gate of the MOSFET for threshold measurement. To the tip of the switch 35, a power supply for generating the word line setting potential VPP is connected, and the word line setting potential Vpp (=2.6V) is applied to the gate of the MOSFET 26. A standard value is a value which is set as a value of the back bias potential VBB, word line non-selecting potential VNN, etc. when the threshold Vth of the cell transistor matches the target value.

The interconnects 31 and 32 connected to the source or drain of the MOSFET for threshold measurement and the interconnect 37 connected to the gate may be shorted during the fabrication step. A correct threshold cannot be determined by measuring such a device, so a DRAM chip having this kind of interconnect defects must be excluded.

The presence of an interconnect defect is detected as follows. First the source terminal and drain terminal are connected to the ground Vss via the LSI tester. Then a high potential (e.g. 1.5V) is applied to the gate terminal 22, and the current which flows into the gate terminal is measured by an ammeter of the LSI tester. If this value is more than a predetermined value, such as 5 µA, it is judged that the interconnects 31 and 32 connected to the source or drain and the interconnect 37 connected to the gate are shorted. In this case, subsequent measurement is not performed. If the measured value is smaller than the predetermined value, processing advances to the next step (step 1).

In the next step, the threshold Vth of the MOSFET for threshold measurement is measured. First a command is sent to the test circuit 10 to start up the VBB internal power supply detection circuit 8 and the VBB internal power supply pump circuit 9, and generate the −0.3V back bias. Then the switch 37 connected to the back gate of the MOSFET for threshold measurement is closed, and the back gate of the MOSFET for threshold measurement and the internal power supply pump circuit 9 are connected. Therefore the standard value −0.3V of the back bias is applied to the back gate of the MOSFET for threshold measurement.

Then the target value 0.7V of the threshold Vth is applied to the gate terminal. 1.5V is applied to the drain terminal. In this state, current which flows into the drain terminal is measured. If the measured value is 1 mA (1 µA×1000) or more, it is judged that a voltage higher than the threshold is being applied to the gate. If the measured value is smaller than 1 mA (1 µA×1000), it is judged that a voltage less than the threshold is being applied to the gate. The voltage is applied and current is measured using the LSI tester.

If it is judged that a voltage higher than the threshold is being applied to the gate, decreasing the gate voltage by 0.025V and the measurement of the drain current is repeated. And the gate voltage when the drain current becomes 1 mA or less is regarded as the threshold Vth. If it is judged that a voltage less than the threshold is being applied to the gate, increasing the gate voltage by 0.025V at a time and the measurement of the drain current is repeated. The gate voltage when the drain current becomes 1 mA or more is regarded as the threshold Vth (step 2).

In this way, the threshold Vth of the MOSFET for threshold measurement is measured, and the result is regarded as the threshold Vth of the cell transistor (step 3).

The measurement of the threshold Vth shown here is just an example, and there are various other methods. Some examples follow.

Examples of methods for judging the presence of an interconnect defect, which is performed before the measurement of the threshold Vth, are as follows.

A first method is connecting the source terminal and drain terminal to the ground Vss via an ammeter of the LSI tester. And a high potential 1.5V is applied to the gate terminal, and the current which flows into the source terminal and drain terminal is measured. If the total of the measured values is 5 µA or more, it is judged that the interconnects 31 and 32 connected to the source or drain and the interconnect 37 connected to the gate are shorted.

A second method is judging the presence of an interconnect defect using the cell monitor Vth detection circuit (FIG. 15) of which source terminal is connected to the ground Vss in the DRAM chip. The drain terminal is connected to the ground Vss via the LSI tester, and a high potential 1.5V is applied to the gate terminal. If the current which flows from the gate terminal is 5 µA or more, it is judged that the interconnects 31 and 32 connected to the source or drain and the interconnect 37 connected to the gate are shorted.

A third method is also a method of judging the presence of an interconnect defect using the cell monitor Vth detection circuit of which source terminal is connected to the ground Vss in the DRAM chip. The drain terminal is connected to the ground Vss via an ammeter of the LSI tester, and a high potential 1.5V is applied to the gate terminal. If the current which flows into the drain terminal is 5 µA or more, it is judged that the interconnects 31 and 32 connected to the drain and the interconnect 37 connected to the gate are shorted.

Now other methods for measuring the threshold Vth of the MOSFET for threshold measurement will be described.

A fourth method is applying −0.3V to the back gate terminal first. Then the source terminal is connected to the ground Vss via the LSI tester. Then 0.7V is applied to the gate terminal and 1 mA (1 µA×1000) of current is supplied to the drain terminal. In this state, the potential of the drain terminal is measured.

If this voltage is lower than 1.5V, the gate voltage is decreased by 0.025V, and the potential of the drain terminal is measured again. This is repeated until the potential of the drain terminal becomes 1.5V or more. The gate voltage when the potential of the drain terminal exceeds 1.5V is regarded as the threshold Vth of the MOSFET for threshold measurement.

If the drain potential at the gate potential (0.7V) is higher than 1.5V, the gate voltage is increased by 0.025V, and the potential of the drain terminal is measured again. This is repeated until the potential of the drain terminal becomes 1.5V or less. The gate voltage when the potential of the drain terminal becomes 1.5V or less is regarded as the threshold Vth of the MOSFET for threshold measurement.

A fifth method is the threshold Vth measurement method shown first as an example, or the fourth method, wherein the back bias VBB is changed according to the potential to be applied to the gate terminal. Specifically, if a value written in the first column in Table 2 is applied to the gate terminal, a value in the second column on the same row is used as the back bias VBB (e.g. if 1.0V is applied to the gate terminal, the back bias VBB is set to −0.4V). Table 2 is used for determining the VNN/VBB value based on the threshold of the MOSFET for threshold measurement. For details, see "(6) VNN/VBB value determination method).

TABLE 2

Table for defining the estimated threshold Vth and the set value of VNN/VBB.

| Threshold Vth | VNN/VB |
|---|---|
| 0.5 | −0.5 |
| 0.55 | −0.45 |
| 0.6 | −0.4 |
| 0.65 | −0.35 |
| 0.7 | −0.3 |
| 0.75 | −0.25 |
| 0.8 | −0.2 |
| 0.85 | −0.15 |
| 0.9 | −0.1 |

Figure 15:
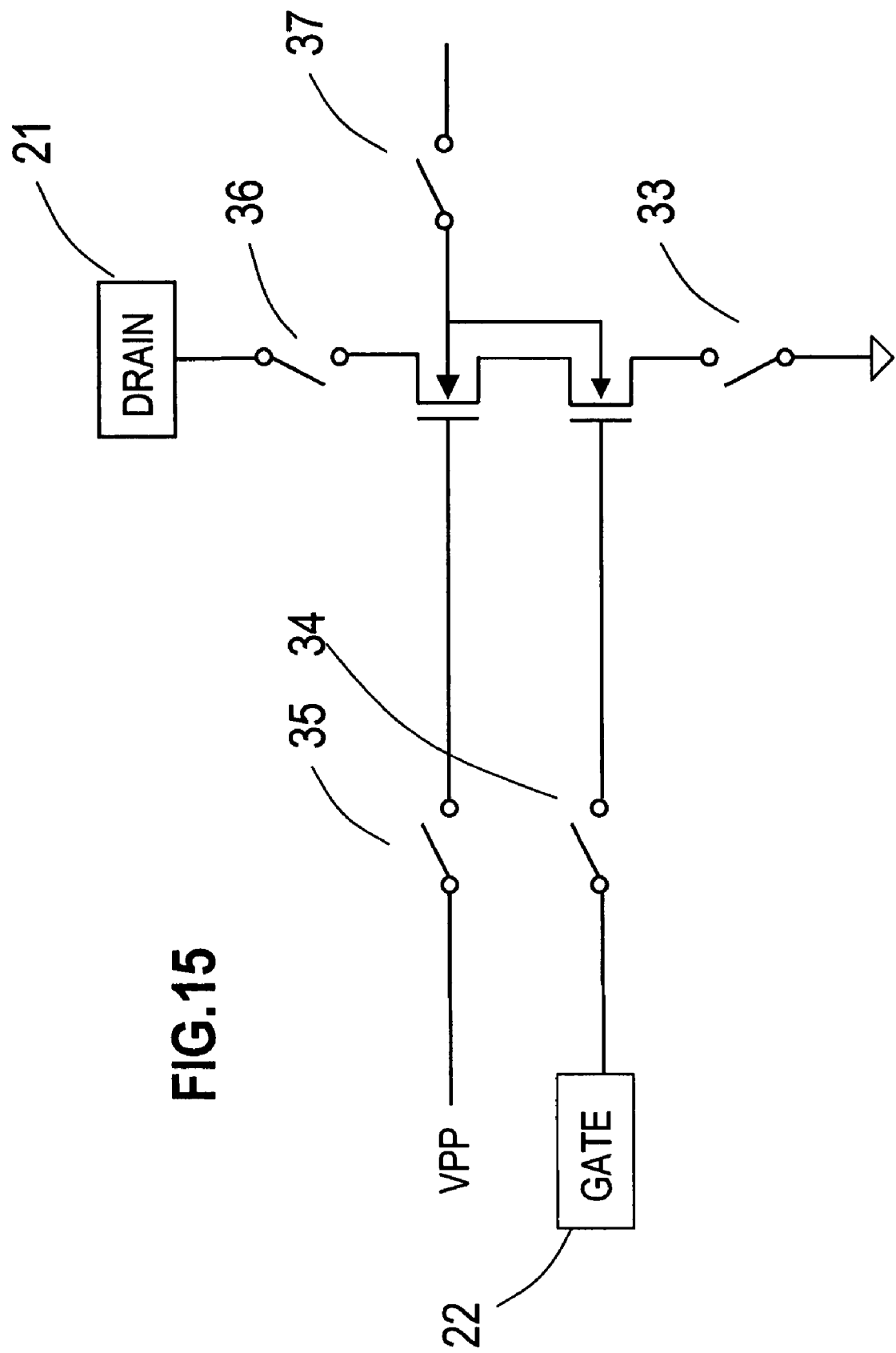
FIG. 15 is a simplified circuit diagram depicting another cell monitor Vth detection circuit.

A sixth method is the above mentioned three methods for measuring the threshold Vth of the MOSFET for threshold measurement, wherein instead of the circuit in FIG. 14, the circuit in FIG. 15 is used as the cell monitor Vth detection circuit. The difference of these circuits is that the source of the MOSFET for threshold measurement is connected not to the source terminal, but to the ground Vss inside the DRAM chip. For either method, the source of the MOSFET for threshold measurement is connected to the ground terminal Vss in the end. Therefore there is no essential difference in the measurement methods themselves.

(6) VNN/VBB Value Determination Method

If it is judged that the cell monitor Vth detection circuit has an interconnect defect, the standard value −0.3V of VNN/VBB is written in the fuse circuit 5. Since the threshold Vth of the cell transistor cannot be estimated using the cell monitor Vth detection circuit in this case, this second best measure is taken (step 4).

If it is judged that an interconnect defect does not exist, a VNN/VBB value to be written to the fuse circuit 5 is determined based on the estimated threshold Vth of the cell transistor acquired using the cell monitor Vth detection circuit.

For the VNN/VBB value to be written, an optimum value is determined in advance by experiment for each estimated value of the threshold Vth, using "(2) Operation principle" as a guide. Table 2 shows an example thereof. In the first column, the estimated threshold value Vth of the transistor is shown, and in the second column, a predetermined VNN/VBB value is shown. Based on such a table, the VNN/VBB value to be written to the fuse circuit 5 is determined.

It is most accurate if the threshold Vth of the cell transistor is estimated using the cell monitor Vth detection circuit formed on the same chip. However, in order to improve operation efficiency, the threshold value Vth may be estimated using the cell monitor Vth detection circuit formed on another chip on the same wafer. In this case, the same VNN/VBB value is written in all the DRAM chips on the same wafer. It is also possible to estimate the threshold Vth using a cell monitor Vth detection circuit on another wafer fabricated together in the same process. In such cases, the cell monitor Vth detection circuit may be fabricated in all the DRAM chips. In this case, the same VNN/VBB value is written in DRAM chips on all the wafers fabricated together in the same process. On a DRAM chip, a chip dedicated to the cell monitor Vth detection circuit may be fabricated together in the same process, without forming the cell monitor Vth detection circuit.

(7) Gate Oxide Film Thickness

The present invention is very effective for a semiconductor device of which gate oxide film is thin as a result of miniaturization and low drive voltage. Particularly the present invention presents a conspicuous effect for a semiconductor device having a MOSFET of which gate oxide film is 0.5 nm or more and 10 nm or less, and the effect is even more conspicuous for a semiconductor device having a MOSFET of which gate oxide film is 0.7 nm or more and 5 nm or less, and the effect is most conspicuous for a semiconductor device having a MOSFET of which gate oxide film is 0.9 nm or more and 2 nm or less. The upper limit of the oxide film thickness indicates a film thickness with which a restore failure or an off leak current failure easily occurs, and the lower limit of the oxide film thickness indicates a film thickness with which dielectric breakdown may easily occur.

(8) Type of Semiconductor Device

The present invention is mainly applied to DRAM. However, the present invention can also be applied to other devices, such as a semiconductor device having a cell comprised of a switch of a MOSFET and a capacitor connected to this switch.

For example, the present invention can also be applied to a semiconductor device in which a storage unit where the above mentioned cells are arrayed in a two-dimensional matrix and an information processing circuit are integrated.

What is claimed is:

1. A semiconductor device comprising:
  a memory cell which comprises a switch which is an MOS transistor and a capacitor, and in which a first source-drain region of the MOS transistor is connected to one electrode of the capacitor; and
  a control circuit for recording one bit of memory data by storing charge in the capacitor or discharging stored charge, and reading one bit of memory data by reading a potential of the capacitor,
  the semiconductor device further comprising:
    a storage circuit for recording a back bias potential value to be applied to a back gate of the MOS transistor; and
    a back gate potential generation power supply which generates a back bias potential based on the back bias potential value, and supplies the back bias potential to the back gate,
    wherein, when a threshold of the MOS transistor is greater than a target threshold value of the MOS transistor, the back bias potential value which is shallower than a target back bias potential is recorded in the storage circuit.

2. The semiconductor device according to claim 1, further comprising:
  a storage circuit for word line non-selecting potential which records a word line non-selecting potential value to be applied to a gate of the MOS transistor for closing the switch; and
  a word line non-selecting potential generation circuit which generates a word line non-selecting potential based on the word line non-selecting potential value, and supplies the word line non-selecting potential to the gate,
  wherein, when a threshold of the MOS transistor is smaller than a target threshold value of the MOS transistor, the word line non-selecting potential value which is deeper than a target word line non-selecting potential is recorded in storage circuit for word line non-selecting potential value.

3. The semiconductor device according to claim 2, wherein the back bias potential value recorded in the storage circuit for recording back bias potential value and the word line non-selecting potential recorded in the storage circuit for word line non-selecting potential value are the same.

4. The semiconductor device according to claim 1, wherein the thickness of gate oxide film of the MOS transistor is 0.5 nm to 10 nm.

5. A semiconductor device comprising:
  a memory cell which comprises a switch which is an MOS transistor and a capacitor, and in which a first source-drain region of the MOS transistor is connected to one electrode of the capacitor; and
  a control circuit for recording one bit of memory data by storing charge in the capacitor or discharging stored charge, and reading one bit of memory data by reading a potential of the capacitor,
  the semiconductor device further comprising:
    a storage circuit for recording a back bias potential value to be applied to a back gate of the MOS transistor; and
    a back gate potential generation power supply which generates a back bias potential based on the back bias potential value, and supplies the generated back bias potential to the back gate,
    wherein, when a threshold of an MOS transistor for monitoring which has a structure identical to and is fabricated in a same process as the MOS transistor is greater than a target threshold value of the MOS transistor, the back bias potential value which is shallower than a target back bias potential is recorded in the storage circuit.

6. The semiconductor device according to claim 5, further comprising:
a storage circuit for word line non-selecting potential which records a word line non-selecting potential value to be applied to a gate of the MOS transistor for closing the switch;
and a word line non-selecting potential generation circuit which generates a word line non-selecting potential based on the word line non-selecting potential value and supplies the word line non-selecting potential to the gate,
wherein when a threshold of an MOS transistor for monitoring which has a structure identical to and is fabricated in a same process as the MOS transistor is smaller than a target threshold value of the MOS transistor, the word line non-selecting potential value which is deeper than a target word line non-selecting potential is recorded in the storage circuit for word line non-selecting potential value.

7. The semiconductor device according to claim 6, wherein of the back bias potential value recorded in the storage circuit for recording back bias potential value and the word line non-selecting potential value recorded in the storage circuit for word line non-selecting potential value are the same.

8. The semiconductor device according to claim 5, wherein the memory cell and one or a plurality of the MOS transistors for monitoring are formed on the same chip.

9. The semiconductor device according to claim 8, wherein there are a plurality of the MOS transistors for monitoring, and sources, drains and gates of the MOS transistors for monitoring are connected in parallel respectively.

10. A semiconductor device comprising:
a memory cell which comprises a switch which is an MOS transistor and a capacitor, and in which a first source-drain region of the MOS transistor is connected to one electrode of the capacitor; and
a control circuit for recording one bit of memory data by storing charge in the capacitor or discharging stored charge, and reading one bit of memory data by reading a potential of the capacitor,
the semiconductor device further comprising:
a storage circuit for word line non-selecting potential value which records a word line non-selecting potential value to be applied to a gate of the MOS transistor for closing the switch; and
a word line non-selecting potential generation circuit which generates a word line non-selecting potential based on of the word line non-selecting potential value, and supplies the word line non-selecting potential to the gate,
wherein, when a threshold of the MOS transistor is smaller than a target threshold value of the MOS transistor, the word line non-selecting potential value which is deeper than a target word line non-selecting potential is recorded in the storage circuit.

11. A semiconductor device comprising:
a memory cell which comprises a switch which is an MOS transistor and a capacitor, and in which a first source-drain region of the MOS transistor is connected to one electrode of the capacitor; and
a control circuit for recording one bit of memory data by storing charge in the capacitor or discharging stored charge, and reading one bit of memory data by reading a potential of the capacitor,
the semiconductor device further comprising:
a storage circuit for word line non-selecting potential value which records a word line non-selecting potential value to be applied to a gate of the MOS transistor for closing the switch;
and a word line non-selecting potential generation circuit which generates a word line non-selecting potential based on the word line non-selecting potential value, and supplies the word line non-selecting potential to the gate,
wherein, when a threshold of an MOS transistor for monitoring which has a structure identical to and is fabricated in a same process as the MOS transistor is smaller than a target threshold value of the MOS transistor, the word line non-selecting potential value which is deeper than a target word line non-selecting potential is recorded in the storage circuit.

12. The semiconductor device according to claim 11, wherein the memory cell and one or a plurality of the MOS transistors for monitoring are formed on the same chip.

13. The semiconductor device according to claim 12, wherein there are a plurality of the MOS transistors for monitoring, and sources, drains and gates of the MOS transistors for monitoring are connected in parallel respectively.

14. A fabrication method for the semiconductor device according to claim 5 comprising:
connecting a source of the MOS transistor for monitoring to a ground potential, applying a first predetermined potential to a gate of the MOS transistor for monitoring, applying a second predetermined potential to a drain of the MOS transistor for monitoring, and measuring a current value which flows into the drain;
when the current value is smaller than a predetermined current value, repeating an operation which increases a potential to be applied to the gate by a predetermined value and remeasures a value of current which flows into the drain until a value of current which flows into the drain exceeds the predetermined current value, and setting a potential being applied to the gate as a threshold of the MOS transistor for monitoring when the value of current which flows into the drain exceeded the predetermined current value;
when the current value exceeds the predetermined current value, repeating an operation which decreases a potential to be applied to the gate by a predetermined value and remeasures a value of current which flows into the drain until a value of current which flows into the drain becomes smaller than the predetermined current value, and setting a potential being applied to the gate as a threshold of the MOS transistor for monitoring when a value of current which flows into the drain becomes smaller than the predetermined current value; and
recording one or both of the back bias potential value and the word line non-selecting potential value determined based on the threshold of the MOS transistor for monitoring into one or both of the storage circuit for recording back bias potential value and the storage circuit for word line non-selecting potential value.

15. A fabrication method for the semiconductor device according to claim 5 comprising:
connecting a source of the MOS transistor for monitoring to a ground potential, applying a predetermined potential to a gate of the MOS transistor for monitoring, supplying a predetermined current to a drain of the MOS transistor for monitoring and measuring a potential value of the drain;

when the potential value exceeds a predetermined potential value, repeating an operation which increases a potential to be applied to the gate by a predetermined value and remeasures a value of potential of the drain until a value of the potential of the drain becomes smaller than the predetermined potential value, and setting a potential being applied to the gate as a threshold of the MOS transistor for monitoring when a value of potential of the drain becomes smaller than the predetermined potential value;

when the potential value is smaller than the predetermined potential value, repeating an operation which decreases a potential to be applied to the gate by a predetermined value and remeasures a value of potential of the drain until a value of potential of the drain exceeds the predetermined potential value, and setting a potential being applied to the gate as a threshold of the MOS transistor for monitoring when a value of potential of the drain exceeds the predetermined potential value; and recording one or both of the back bias potential value and the word line non-selecting potential value determined based on the threshold of the MOS transistor for monitoring, acquired in the second or third step, into one or both of the storage circuit for recording back bias potential value and the storage circuit for word line non-selecting potential value.

16. A fabrication method for the semiconductor device according to claim 5 comprising:

confirming whether a gate of the MOS transistor for monitoring and one or both of source and drain thereof are shorted;

when the gate and one or both of the source and the drain are not shorted, connecting a source of the MOS transistor for monitoring to a ground potential, applying a first predetermined potential to a gate of the MOS transistor for monitoring, applying a second predetermined potential to a drain of the MOS transistor for monitoring, and measuring a current value which flows into the drain; when the current value is smaller than a predetermined current value, repeating an operation which increases a potential to be applied to the gate by a predetermined value and remeasures a value of current which flows into the drain until a value of current which flows into the drain exceeds the predetermined current value, and setting a potential being applied to the gate as a threshold of the MOS transistor for monitoring when the value of current which flows into the drain exceeded the predetermined current value; when the current value exceeds the predetermined current value, repeating an operation which decreases a potential to be applied to the gate by a predetermined value and remeasures a value of current which flows into the drain until a value of current which flows into the drain becomes smaller than the predetermined current value, and setting a potential being applied to the gate as a threshold of the MOS transistor for monitoring when a value of current which flows into the drain becomes smaller than the predetermined current value; recording one or both of the back bias potential value and the word line non-selecting potential value determined based on the threshold of the MOS transistor for monitoring into one or both of the storage circuit for recording back bias potential value and the storage circuit for word line non-selecting potential value; and when the gate and one or both of the source and the drain are shorted, setting a predetermined threshold as a threshold of the MOS transistor for monitoring when the gate and one or both of the source and the drain are shorted; and recording one or both of the back bias potential value and the word line non-selecting potential value determined based on the threshold of the MOS transistor for monitoring into one or both of the storage circuit for recording back bias potential value and the storage circuit for word line non-selecting potential value.

17. A fabrication method for the semiconductor device according to claim 5 comprising: confirming whether a gate of the MOS transistor for monitoring and one or both of source and drain thereof are shorted;

when the gate and one or both of the source and the drain are not shorted, connecting a source of the MOS transistor for monitoring to a ground potential, applying a predetermined potential to a gate of the MOS transistor for monitoring, supplying a predetermined current to a drain of the MOS transistor for monitoring and measuring a potential value of the drain; when the potential value exceeds a predetermined potential value, repeating an operation, which increases a potential to be applied to the gate by a predetermined value and remeasures a value of potential of the drain until a value of the potential of the drain becomes smaller than the predetermined potential value, and setting a potential being applied to the gate as a threshold of the MOS transistor for monitoring when a value of potential of the drain becomes smaller than the predetermined potential value; when the potential value is smaller than the predetermined potential value, repeating an operation, which decreases a potential to be applied to the gate by a predetermined value and remeasures a value of potential of the drain until a value of potential of the drain exceeds the predetermined potential value, and setting a potential being applied to the gate as a threshold of the MOS transistor for monitoring when a value of potential of the drain exceeds the predetermined potential value; and recording one or both of the back bias potential value and the word line non-selecting potential value determined based on the threshold of the MOS transistor for monitoring, acquired in the second or third step, into one or both of the storage circuit for recording back bias potential value and the storage circuit for word line non-selecting potential value; and when the gate and one or both of the source and the drain are shorted, setting a predetermined threshold as a threshold of the MOS transistor for monitoring when the gate and one or both of the source and the drain are shorted; and recording one or both of the back bias potential value and the word line non-selecting potential value determined based on the threshold of the MOS transistor for monitoring into one or both of the storage circuit for recording back bias potential value and the storage circuit for word line non-selecting potential value.

18. The fabrication method for the semiconductor device according to claim 16, wherein the predetermined threshold is the target threshold value.

19. The fabrication method for the semiconductor device according to claim 17, wherein the predetermined threshold is the target threshold value.

* * * * *